(12) United States Patent
Vizbaras et al.

(10) Patent No.: US 11,177,630 B2
(45) Date of Patent: Nov. 16, 2021

(54) WAVELENGTH DETERMINATION FOR WIDELY TUNABLE LASERS AND LASER SYSTEMS THEREOF

(71) Applicant: Brolis Sensor Technology, UAB, Vilnius (LT)

(72) Inventors: Augustinas Vizbaras, Vilnius (LT); Ieva Simonyte, Panevezys (LT); Andreas De Groote, Sint-Antelinks (BE); Kristijonas Vizbaras, Vilnius (LT)

(73) Assignee: Brolis Sensor Technology, UAB, Vilnius (LT)

( * ) Notice: Subject to any disclaimer, the term of this patent is extended or adjusted under 35 U.S.C. 154(b) by 0 days.

(21) Appl. No.: 16/965,867

(22) PCT Filed: Jan. 31, 2019

(86) PCT No.: PCT/EP2019/052367
§ 371 (c)(1),
(2) Date: Jul. 29, 2020

(87) PCT Pub. No.: WO2019/149815
PCT Pub. Date: Aug. 8, 2019

(65) Prior Publication Data
US 2021/0021099 A1 Jan. 21, 2021

Related U.S. Application Data

(60) Provisional application No. 62/625,696, filed on Feb. 2, 2018.

(51) Int. Cl.
*G01J 3/30* (2006.01)
*H01S 5/0687* (2006.01)
(Continued)

(52) U.S. Cl.
CPC ............ *H01S 5/0687* (2013.01); *G01N 21/39* (2013.01); *H01S 5/141* (2013.01); *G01N 2021/399* (2013.01); *H01S 5/3013* (2013.01)

(58) Field of Classification Search
CPC .......... G01J 3/4406; G01J 3/02; G01N 21/78; G01N 21/645; G01N 21/6458
(Continued)

(56) References Cited

U.S. PATENT DOCUMENTS

| | | |
|---|---|---|
| 4,912,451 A | 3/1990 | Sugiyama et al. |
| 5,442,221 A | 8/1995 | Mosser et al. |

(Continued)

FOREIGN PATENT DOCUMENTS

| | | |
|---|---|---|
| AU | 6502500 A | 2/2001 |
| AU | 1305802 A | 4/2002 |

(Continued)

OTHER PUBLICATIONS

Duan et al., "Hybrid III-V on Silicon Lasers for Photonic Integrated Circuits on Silicon", IEEE Journal of Selected Topics in Quantum Electronics, vol. 20, No. 4, Jul. 1, 2014, pp. 158-170.
(Continued)

*Primary Examiner* — Md M Rahman
(74) *Attorney, Agent, or Firm* — Goodwin Procter LLP

(57) ABSTRACT

Methods for wavelength determination of widely tunable lasers and systems thereof may be implemented with solid-state laser based photonic systems based on photonic integrated circuit technology as well as discrete table top systems such as widely-tunable external cavity lasers and systems. The methods allow integrated wavelength control enabling immediate system wavelength calibration without the need for external wavelength monitoring instruments. Wavelength determination is achieved using a monolithic solid-state based optical cavity with a well-defined trans-
(Continued)

mission or reflection function acting as a wavelength etalon. The solid-state etalon may be used with a wavelength shift tracking component, e.g., a non-balanced interferometer, to calibrate the entire laser emission tuning curve within one wavelength sweep. The method is particularly useful for integrated photonic systems based on Vernier-filter mechanism where the starting wavelength is not known a-priori, or for compact widely tunable external cavity lasers eliminating the need for calibration of wavelength via external instruments.

13 Claims, 25 Drawing Sheets

(51) Int. Cl.
   *G01N 21/39* (2006.01)
   *H01S 5/14* (2006.01)
   *H01S 5/30* (2006.01)

(58) Field of Classification Search
   USPC .......................................................... 356/318
   See application file for complete search history.

(56) References Cited

U.S. PATENT DOCUMENTS

| | | |
|---|---|---|
| 5,456,206 A | 10/1995 | Lee et al. |
| 5,657,189 A | 8/1997 | Sandhu |
| 5,945,676 A | 8/1999 | Khalil et al. |
| 6,205,159 B1 | 3/2001 | Sesko et al. |
| 6,316,124 B1 | 11/2001 | Boos et al. |
| 6,327,036 B1 | 12/2001 | Bao et al. |
| 6,345,059 B1 | 2/2002 | Flanders |
| 6,442,413 B1 | 8/2002 | Silver |
| 6,567,433 B2 | 5/2003 | May |
| 6,587,484 B1 | 7/2003 | May |
| 6,600,760 B1 | 7/2003 | Green et al. |
| 6,611,341 B2 | 8/2003 | May |
| 6,633,593 B2 | 10/2003 | Ksendzov et al. |
| 6,671,296 B2 | 12/2003 | May |
| 6,690,687 B2 | 2/2004 | Ksendzov et al. |
| 6,693,928 B2 | 2/2004 | May |
| 6,714,309 B2 | 3/2004 | May |
| 6,728,279 B1 | 4/2004 | Sarlet et al. |
| 6,816,636 B2 | 11/2004 | Cole et al. |
| 6,816,743 B2 | 11/2004 | Moreno et al. |
| 6,853,654 B2 | 2/2005 | McDonald et al. |
| 6,879,619 B1 | 4/2005 | Green et al. |
| 6,888,856 B2 | 5/2005 | Green et al. |
| 7,027,470 B2 | 4/2006 | May |
| 7,046,704 B2 | 5/2006 | Fischer |
| 7,061,943 B2 | 6/2006 | Coldren et al. |
| 7,120,176 B2 | 10/2006 | McDonald et al. |
| 7,230,963 B2 | 6/2007 | Menon et al. |
| 7,295,783 B2 | 11/2007 | Singh et al. |
| 7,356,364 B1 | 4/2008 | Bullock et al. |
| 7,388,235 B2 | 6/2008 | Boos et al. |
| 7,460,567 B2 | 12/2008 | May |
| 7,495,838 B2 | 2/2009 | Krneta et al. |
| 7,502,532 B2 | 3/2009 | McCallion et al. |
| 7,564,548 B2 | 7/2009 | Flanders et al. |
| 7,773,642 B2 | 8/2010 | Yamazaki |
| 8,164,748 B1 | 4/2012 | Flanders et al. |
| 8,311,067 B2 | 11/2012 | Ensher et al. |
| 8,452,356 B2 | 5/2013 | Vestel et al. |
| 8,467,051 B2 | 6/2013 | Flanders et al. |
| 8,831,050 B2 | 9/2014 | Gao |
| 9,559,484 B2 | 1/2017 | Morton et al. |
| 9,583,913 B1 | 2/2017 | Fang et al. |
| 9,653,882 B1 | 5/2017 | Zheng et al. |
| 9,692,207 B2 | 6/2017 | Fang et al. |
| 9,748,726 B1 | 8/2017 | Morton et al. |
| 9,755,753 B2 | 9/2017 | Blumenthal |
| 2001/0021803 A1 | 9/2001 | Blank et al. |
| 2003/0016707 A1 | 1/2003 | McDonald et al. |
| 2005/0261561 A1 | 11/2005 | Jones et al. |
| 2006/0193354 A1 | 8/2006 | Rosenblatt |
| 2006/0238775 A1 | 10/2006 | Lopushansky et al. |
| 2007/0047599 A1 | 3/2007 | Wysocki et al. |
| 2007/0179367 A1 | 8/2007 | Ruchti et al. |
| 2008/0139906 A1 | 6/2008 | Bussek |
| 2009/0141748 A1 | 6/2009 | Koyama et al. |
| 2013/0016744 A1 | 1/2013 | Li et al. |
| 2013/0182729 A1 | 7/2013 | Li et al. |
| 2014/0138746 A1 | 5/2014 | Abrokwah et al. |
| 2014/0176958 A1 | 6/2014 | Flanders et al. |
| 2014/0307753 A1 | 10/2014 | Minneman et al. |
| 2015/0282716 A1 | 10/2015 | Smeltzer et al. |
| 2015/0349485 A1 | 12/2015 | Selwan et al. |
| 2016/0161685 A1 | 6/2016 | Xu et al. |
| 2016/0282265 A1 | 9/2016 | Su et al. |
| 2016/0345872 A1 | 12/2016 | Wasson et al. |
| 2016/0356959 A1 | 12/2016 | Jayatilleka et al. |
| 2017/0141536 A1 | 5/2017 | Fang et al. |
| 2017/0163009 A1 | 6/2017 | Choi |
| 2020/0069225 A1 | 3/2020 | Vizbaras et al. |

FOREIGN PATENT DOCUMENTS

| | | |
|---|---|---|
| AU | 1305902 A | 4/2002 |
| AU | 3054602 A | 5/2002 |
| AU | 2002239673 A1 | 7/2002 |
| AU | 2002362396 A1 | 4/2003 |
| CA | 2559990 A1 | 10/2005 |
| CN | 1316696 A | 10/2001 |
| CN | 1554139 A | 12/2004 |
| CN | 1938917 A | 3/2007 |
| CN | 103515840 A | 1/2014 |
| CN | 104568751 A | 4/2015 |
| CN | 104568907 A | 4/2015 |
| CN | 105140777 A | 12/2015 |
| EP | 1214762 A1 | 6/2002 |
| EP | 1354382 A2 | 10/2003 |
| EP | 1436864 A2 | 7/2004 |
| EP | 1737090 A1 | 12/2006 |
| EP | 2575220 A2 | 4/2013 |
| EP | 3002568 A1 | 4/2016 |
| JP | 2004528701 A | 9/2004 |
| JP | 2008-301944 A | 12/2008 |
| JP | 2009238972 A | 10/2009 |
| JP | 2012-89651 A | 5/2012 |
| KR | 100837126 B1 | 6/2008 |
| TW | 200537773 A | 11/2005 |
| WO | WO-0108277 A1 | 2/2001 |
| WO | WO-0231931 A2 | 4/2002 |
| WO | WO-0231933 A2 | 4/2002 |
| WO | WO-0235667 A2 | 5/2002 |
| WO | WO-2002054544 A2 | 7/2002 |
| WO | WO-02082599 A1 | 10/2002 |
| WO | WO-03030311 A2 | 4/2003 |
| WO | WO-2004015826 A1 | 2/2004 |
| WO | WO-2005096462 A1 | 10/2005 |
| WO | WO-2005099421 A2 | 10/2005 |
| WO | WO-2011/029886 A1 | 3/2011 |
| WO | WO-2015018352 A1 | 2/2015 |
| WO | WO-2017/021971 A1 | 2/2017 |
| WO | WO-2018/215388 A1 | 11/2018 |

OTHER PUBLICATIONS

Friedland et al., "New Concept for the reduction of impurity scattering in remotely doped GaAs quantum wells," Phys. Rev. Lett., vol. 77, No. 22, 1996.

Hayne et al., "Remote impurity scattering in modulation-doped GasAs/ Al, Ga 1_. As heterojunctions", Phys. Rev. B., vol. 57, No. 23, 1998.

International Search Report and Written Opinion in PCT/EP2014/062672 dated Mar. 17, 2015, 11 pages.

International Search Report and Written Opinion dated Nov. 18, 2013 in PCT/EP2013/0717, 12 pages.

(56) References Cited

OTHER PUBLICATIONS

International Search Report and Writtne Opinion dated Jul. 26, 2019 in PCT/EP2019/052367, 27 pages.
International Search Report and Writtne Opinion dated Sep. 26, 2018 in PCT/EP2018/063260, 19 pages.
Komlenovic et al., "Widely-Tunable Ring-Resonator Semiconductor Lasers" Applied Sciences, 2017, 7(7); 732, 21 pages.
Kraus et al., "Optimization of the doping levels in doubly doped in AlAs/InGaAs HEMTs," Compound Semiconductors 1997, Proceedings of the IEEEE 24th International Symposium on Compound Semiconductors, San Diego, CA, Sep. 8-11, 1997, pp. 503-508.
Lin, Hongtao et al., "Mid-infrared integrated photonics on silicon: a perspective", Nanophotonics, 2018; 7(2): 393-420.
Ohtsu M. et al., "A simple interferometric method for monitoring mode hopping in tunable external-cavity semiconductor lasers", Journal of Lightwave Technology, IEEE, USA, vol. 7, No. 1, Jan. 1, 1989, pp. 68-76.
Pavlovska, et al., "in situ studies of the role of excess Ga on the growth morphology of thin GaN layers," Surface Science, vol. 496, (2002), pp. 160-178.
R. Wang et al., "III-V-on-Silicon Photonic Integrated Circuits for Spectroscopic Sensing in the 2-4 um Wavelength Range", Sensors 17 (8), 1788, 2017.
Roelkens et al., "III-V-on-Silicon Photonic Devices for Optical Communication and Sensing", PHOTONICS, vol. 2, No. 3, Sep. 18, 2015, pp. 969-1004.
Saxena et al., "Determination of alloy scattering potential in Ga1x Al x As alloys," J. Appl. Phys., vol. 58, 2640, 1985.
Songlin Yu, et al., "In vitro glucose measurement using tunable mid-infrared laser spectroscopy combined with fiber-optic sensor", Biomedical Optics Express, vol. 5, No. 1, Dec. 17, 2013, 12 pages.
Tuttle et al., "Effects of interface layer sequencing on the transport properties of InAs/ AlSb quantum wells: evidence for anti site donors at the InAs/ AlSb interface," J. Appl. Phys., 67, 3032 (1990).
Wang et al., "IIIV-on-Silicon Photonic Integrated Circuits for Spectroscopic Sensing in the 24 ?m Wavelength Range" Sensors 2017, 17(8), 1788.
Wang et al., "Compact GaSb/silicon-on-insulator 2.0 μm widely tunable external cavity lasers", Optics Express, vol. 24, No. 25, Dec. 12, 2016.
U.S. Appl. No. 16/609,355 Published as: US2020/0069225, Tunable Hybrid III-V/ IV Laser Sensor System-on-a-Chip for Real-Time Monitoring of a Blood Constituent Concentration Level, filed Oct. 29, 2019.
Are Alvor Aastveit et al., "Near-Infrared Reflectance Spectroscopy: Different Strategies for Local Calibrations in Analyses of Forage Quality", Applied Spectroscropy, The Society For Applied Sprectroscopy, Baltimore, US, vol. 47, No. 4, Apr. 1, 1993 (Apr. 1, 1993), pp. 463-469, XP000356631, ISSN: 0003-7028, DOI: 10.1366/0003702934334912.
Tormod Naes et al., "Splitting of Calibration Data By Cluster Analyisis", Journal of Chemometrics, Wiley, Chichester, Sussex, England, GB, vol. 5, No. 1, Jan. 1, 1991 (Jan. 1, 1991), pp. 49-65, XP000171347, ISSN: 0886-9383, DOI: 10.1002/CEM.1180050106.
Yao Zhanshi et al.., "Integrated Silicon Photonic Microresonators: Emerging Technologies", IEEE Journal of Selected Topics in Quantum Electronics, Service Center, Piscataway, NJ, US, vol. 24, No. 6, Nov. 1, 2018 (Nov. 1, 2018), pp. 1-24, XP011685808, ISSN: 1077-260X, DOI: 10.1109/JSTQE.2018.2846047 [retrieved on Jun. 21, 2018].

(a)

(b)

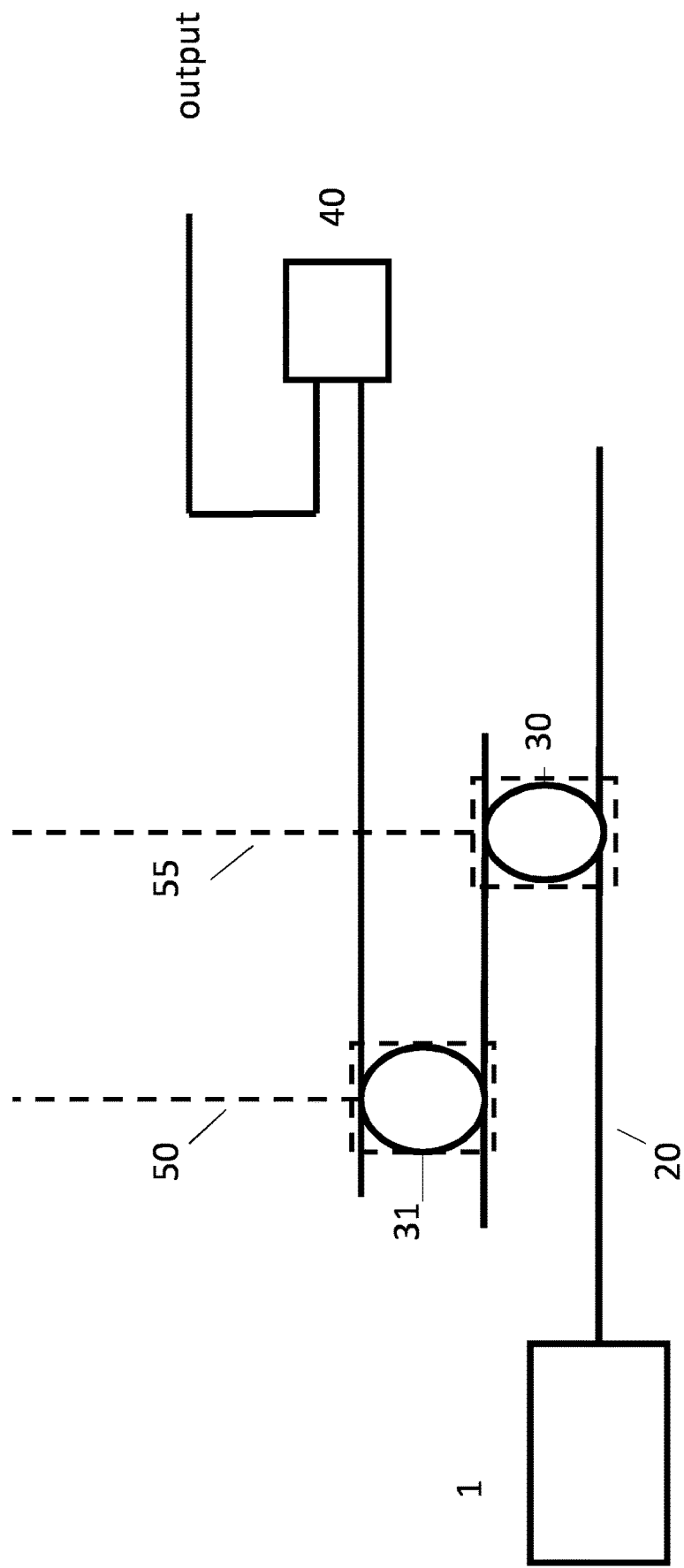

Time (μs)

Wavelength ( nm )

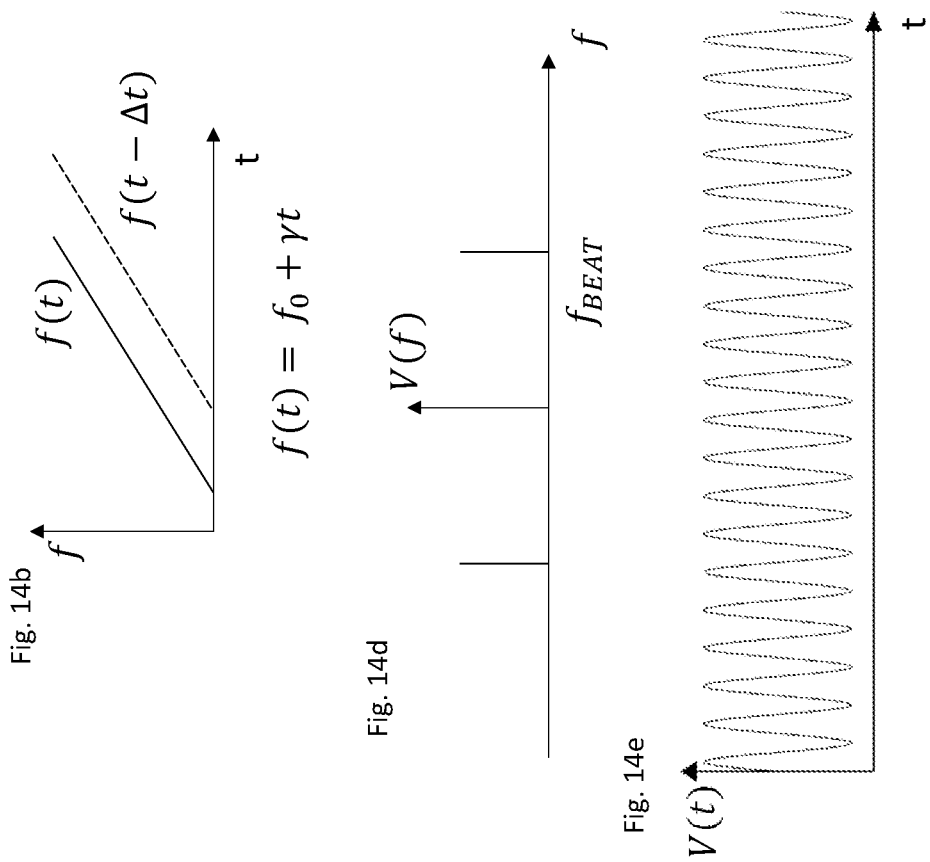
Fig. 14b
Fig. 14d
Fig. 14e
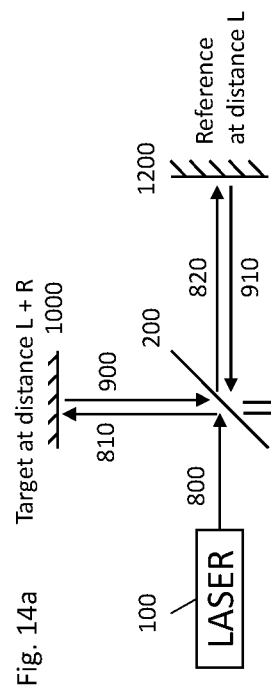
Fig. 14a
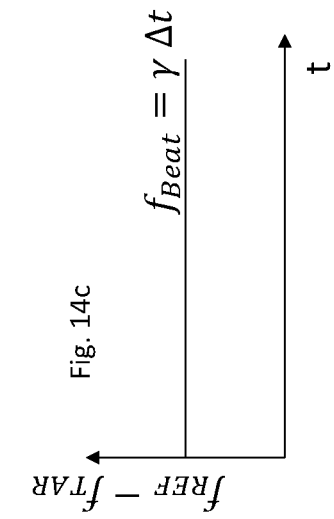
Fig. 14c

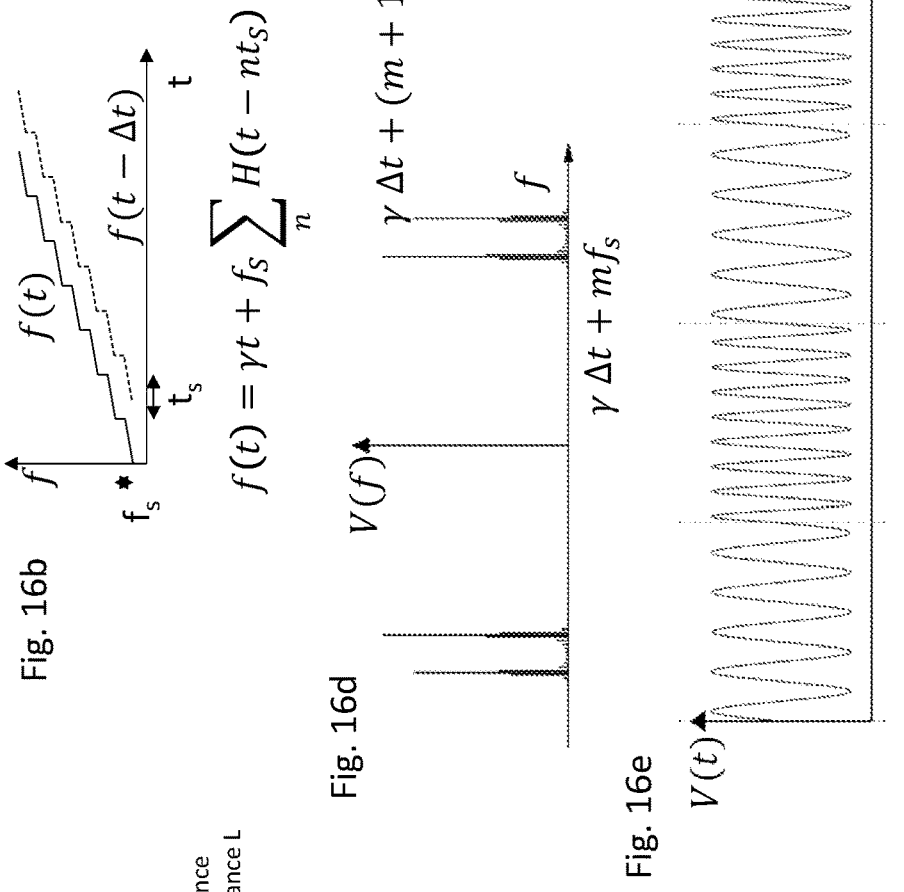
Fig. 16b
Fig. 16d
Fig. 16e
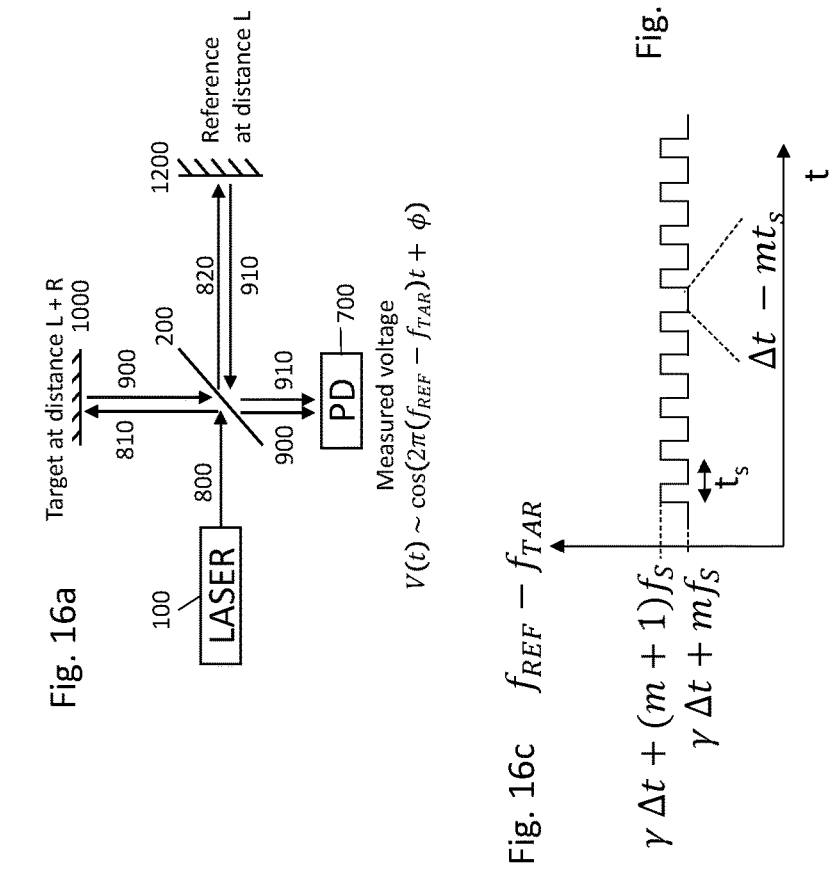
Fig. 16a
Fig. 16c

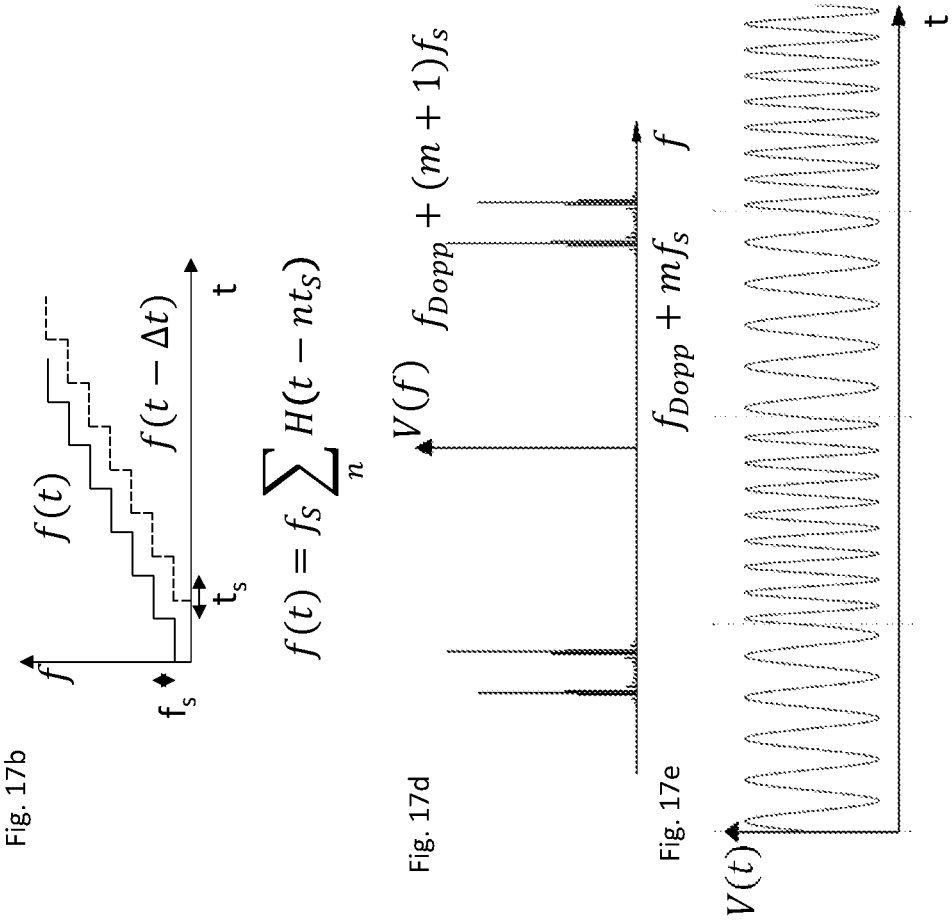
Fig. 17b
Fig. 17d
Fig. 17e
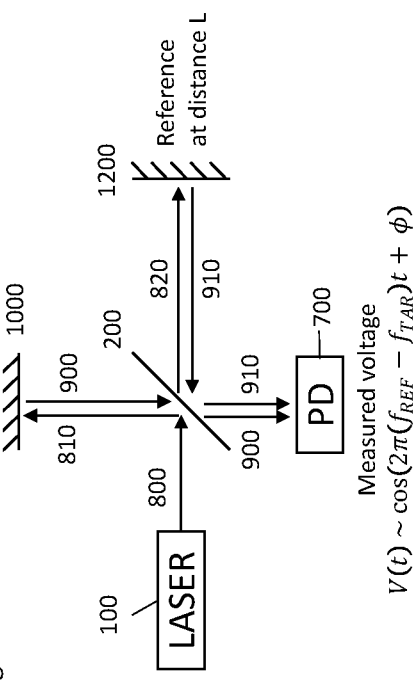
Fig. 17a  Target at distance L + R, moving at speed v
Fig. 17c 100-1XX widely tunable laser
200 – beam combiner
600 – output port
810 – output beam to target
900 – return beam from target
1000 – target/sample
1200 – Reference
700 – detection port
1100- WTL based system

WAVELENGTH DETERMINATION FOR WIDELY TUNABLE LASERS AND LASER SYSTEMS THEREOF

RELATED APPLICATIONS

This application is a U.S. National Stage Application filed under 35 U.S.C. § 371 of International Patent Application No. PCT/EP2019/052367, filed Jan. 31, 2019, which claims the benefit of priority to U.S. Provisional Application Ser. No. 62/625,696 filed Feb. 2, 2018; the contents of both applications are incorporated herein by reference in their entireties.

FIELD OF THE INVENTION

Embodiments of this invention relate to wavelength determination and auto-calibration of semiconductor-based widely tunable lasers and laser systems thereof such as external cavity lasers based on discrete optical elements and semiconductor gain-medium or external cavity lasers based on photonic integrated circuit technology. Precise wavelength determination is performed using an integrated solid source etalon with a well-defined transmission or reflection function in combination with relative wavelength tuning direction monitoring, allowing auto-calibration of the system emission wavelength during one wavelength sweep. Embodiments of the invention are particularly useful for applications in spectroscopic sensing, optical coherent tomography, LIDAR, secure face recognition, etc.

BACKGROUND

Widely tunable lasers based on semiconductor lasers can be realized in many ways such as embedding a semiconductor-based gain chip into an external cavity configuration (see U.S. Patent Publication Nos. 2007/0047599 A1, US2006/0193354 A1, and US2003/0016707 A1, and U.S. Pat. Nos. 6,327,036 and 6,714,309, realizing the cavity and tuning sections monolithically in one chip (see U.S. Pat. No. 6,728,279), or realizing the widely tunable laser based on a combination of chips, such as combining III-V semiconductor gain-chip with silicon photonic integrated circuit (Si PIC) which could be based on silicon-on-insulator, silicon nitride or germanium-on-insulator and other material platforms (see R. Wang et al. *Sensors* 17, 1788, 2017; R. Wang et al.; *Optics Express* 24 (25), 28977-28986, 2016; and H. Lin et al.; *Nanophotonics*, Vol. 7, Issue 2, (2017) pages 393-420; and WO 2018/215388. Each of these publications is incorporated by reference herein in its entirety.

In the case of non-monolithic widely-tunable laser concepts, such as an external cavity laser diode based on Metcalf-Littman or Littrow configurations, absolute wavelength control is typically achieved by calibrating the mechanical motor position after referring to the output wavelength measured with external instruments, such as spectrometer or spectral analyzer. A disadvantage of such methods is that the performance of wavelength calibration requires external instruments. Other methods include using complex and/or bulky etalons such as filters, gas cells or electronically tunable gratings and locking to a Fabry-Perot cavity.

SUMMARY

In accordance with embodiments of the invention, an all-solid state device enables absolute wavelength reference and wavelength tracking. The device may include a widely tunable laser, a wavelength shift tracking device such as an interferometer, and an etalon such as an offset distributed Bragg reflector or any optical cavity. A portion of the beam is split and passed along the wavelength shift tracking device and a solid-state etalon. Individual detectors are used to register the signal at the output of wavelength shift tracking device and solid state etalon. Due to the etalon's distinct, wavelength specific transmission/reflection function, the output signal at the etalon provides a distinct signal (either high or low) once the laser wavelength is tuned to the specific wavelength of the etalon. At the same time, the output of the wavelength shift tracking device, in the form of non-balanced interferometer records an oscillating periodic signal as a function of time. The period of the signal is directly related to the optical beam path difference between the arms of the interferometer, and thus provides information on the wavelength shift with time. Combined with the reading from the etalon output, the entire laser tuning curve can be reconstructed, providing absolute wavelength information at any moment of time within the sweep.

This configuration allows simple, low-cost, and virtually maintenance-free wavelength calibration during the wavelength sweep for any external cavity laser. The distinct and unambiguous modulation curve can be used as an absolute wavelength reference. The same principle can be transferred to monolithic and hybrid III-V/IV widely tunable lasers and integrated photonic circuits using such lasers. In both cases the wavelength etalon is passive, based on the same semiconductor technology, low cost, and simple to operate.

In an aspect, embodiments of the invention relate to a solid-state laser-based device including a solid-state gain medium based widely tunable laser for emitting light, a wavelength shift tracking device for tracking a wavelength shift of the emitted light, and a solid-state based etalon. The solid-state based etalon includes an optical element having at least one of an unambiguous transmission spectrum or an unambiguous reflection spectrum. During a wavelength sweep of the widely tunable laser, the solid-state based etalon and wavelength shift tracking device are configured to cooperate to provide absolute wavelength determination and control of the widely tunable laser.

One or more of the following features may be included. During the wavelength sweep, the wavelength shift tracking device may provide an output of wavelength shift as a function of time, and the solid state etalon provides an output of a signal with information about the absolute wavelength at one moment of time during the sweep. A combination of the outputs of the solid state based etalon and the wavelength shift tracking device may allow reconstruction of an entire laser tuning curve during the sweep. This is in particularly advantageous when the wavelength sweep is nonlinear for applications such as spectroscopic sensing, OCT or Frequency-Modulated-Continuous-Wave (FMCW) LIDAR. In these applications, a linear wavelength sweep across a large bandwidth is required. However, in most practical scenarios, phase change is non-linear. The described embodiments of the invention allow tracking the function of the phase (wavelength) change and thus taking it into account for signal processing.

The widely tunable laser may include an external cavity diode laser including a semiconductor gain-chip and a plurality of free-space optical elements, configured in at least one of a Littrow or a Metcalf-Littman configuration.

The widely tunable laser, wavelength shift tracking device, and solid state wavelength reference etalon may be monolithically realized within a single semiconductor chip.

The widely tunable laser may include an external cavity laser configuration including a III-V semiconductor gain-chip hybridly or heterogeneously integrated onto a group-IV semiconductor based photonic integrated circuit chip. The group-IV photonic integrated circuit chip may include at least one of a silicon-on-insulator, silicon nitride, or a germanium-on-insulator material platform.

The etalon may include a resonant optical cavity, such as a distributed Bragg reflector mirror, distributed feedback grating, a coupled ring resonator, a race track resonator, and/or a Fabry-Perot cavity.

The laser-based device may include at least one photodetector, with the at least one photodetector and the resonant optical cavity being configured and arranged to cooperate to enable the determination of an absolute wavelength. The at least one photodetector may be configured and arranged to enable calibration of an emission wavelength of the laser during the wavelength sweep.

The wavelength shift tracking device may include a non-balanced interferometer, such as, e.g., a Mach-Zehnder interferometer, a multimode interference device, and a Michelson interferometer, and at least one photodetector.

The solid-state gain medium may include a III-V semiconductor based gain chip. The III-V semiconductor may include Al, Ga, In, As, Sb, P, N, Bi, and/or alloy combinations thereof.

The laser may be mode-hopping.

In another aspect, embodiments of the invention relate to a method for wavelength determination and control of a widely tunable laser, the method including providing a laser-based device including a solid-state gain medium based widely tunable laser, a wavelength shift tracking device, and a solid-state etalon. A wavelength sweep is performed with light emitted by the widely tunable laser. In parallel, (i) wavelength shift of the emitted light is tracked and recorded with the wavelength shift tracking device and (ii) absolute wavelength values of the emitted light are recorded with the solid-state etalon. A laser tuning curve is calibrated using a value of the recorded wavelength shift in combination with an absolute wavelength value recorded with the solid-state etalon.

One or more of the following features may be included. The wavelength shift tracking device may include a non-balanced interferometer, and tracking the wavelength shift includes using at least one photodetector to monitor an output port of the non-balanced interferometer. At least one photodetector may be used to monitor an output of the solid-state etalon to determine the absolute wavelength value.

The recorded wavelength shift and recorded absolute wavelength values may be used in cooperation to calibrate an entire laser wavelength tuning curve within one wavelength sweep.

In yet another aspect, embodiments of the invention relate to a method for performing spectroscopic sensing of a substance. The method includes providing a solid state laser-based device including a solid-state gain medium based widely tunable laser for emitting light; a wavelength shift tracking device for tracking a wavelength shift of the emitted light; and a solid-state based etalon including an optical element having at least one of an unambiguous transmission spectrum or an unambiguous reflection spectrum. During a wavelength sweep of the widely tunable laser, the solid-state based etalon and wavelength shift tracking device are configured to cooperate to provide absolute wavelength determination and control of the widely tunable laser. The solid state laser-based device is disposed in optical communication with a target object including the substance. Light emitted from the widely tunable laser is transmitted to the target object, the transmitted light interacting with molecules within the substance, and light-molecule interactions modifying spectral properties of the transmitted light. A wavelength sweep with light emitted by the widely tunable laser is performed, with the emitted light being swept across a spectral bandwidth coinciding with at least one of (i) a fundamental or first overtone of C—H molecular bond stretching vibrations or (ii) a combination of stretching and bending vibrations of C—H, N—H and O—H molecular bonds, absorption spectra of the molecular bond stretching and bending vibrations being molecule-specific and unique. In parallel, (i) wavelength shift of the emitted light with the wavelength shift tracking device is tracked and recorded and (ii) absolute wavelength values of the emitted light with the solid-state etalon is recorded. A laser tuning curve is calibrated using a value of the recorded wavelength shift in combination with an absolute wavelength value recorded with the solid-state etalon. A light signal from the target object is collected by at least one of transmission or diffuse reflection. The collected light signal is processed to characterize the substance.

One or more of the following features may be included. Characterizing the substance may include calculating a concentration level of a molecule in the substance. The concentration level may be expressed in a calibrated unit, such as mg/dL, mmol/l, or g/l.

Characterizing the substance may include determining a species of at least one molecule disposed in the substance. Characterizing the substance may include determining a presence or absence of a molecular species in the substance.

The target object may include at least a portion of a human body. The target object may include an isolated physiological substance, such as whole blood, blood serum, plasma, interstitial fluid, exhaled breath, and/or combinations thereof.

Processing the light signal may include statistical regression. The statistical regression may be based on a multivariate partial least square algorithm constructed using known target molecule absorbance and corresponding concentration data within the substance.

The laser may be mode-hopping.

The recorded wavelength shift and recorded absolute wavelength values may be used in cooperation to calibrate an entire laser wavelength tuning curve within one wavelength sweep.

A wavelength tuning function of the wavelength sweep may be discontinuous and may be a staircase function, a sloped staircase function, a linear function, and/or an arbitrary superposition of the staircase function, the sloped staircase function and the linear function.

In still another aspect, embodiments of the invention relate to a method for using a solid state laser-based device to measure a key indicator of a remote object. The method includes providing the solid state laser-based device including a solid-state gain medium based widely tunable laser for emitting light, a wavelength shift tracking device for tracking a wavelength shift of the emitted light, a photodetector; and a solid-state based etalon including an optical element having at least one of an unambiguous transmission spectrum or an unambiguous reflection spectrum. During a wavelength sweep of the widely tunable laser, the solid-state based etalon and wavelength shift tracking device are configured to cooperate to provide absolute wavelength determination and control of the widely tunable laser. A wavelength sweep with light emitted by the widely tunable laser is performed. In parallel, (i) the wavelength shift of the emitted light is tracked and recorded with the wavelength shift tracking device and (ii) absolute wavelength values of the emitted light with the solid-state etalon are recorded. A laser tuning curve is calibrated using a value of the recorded wavelength shift in combination with an absolute wavelength value recorded with the solid-state etalon. Light is emitted with the laser, wherein (i) the laser is mode-hopping and a difference between the mode-hops is known, (ii) a wavelength tuning function of the wavelength sweep is discontinuous, and (iii) light emitted with the laser is divided into two paths, a length of the first path including a known distance to a reference object and a length of the second path including a distance to the remote object. After the emitted light impinges upon the remote object and the reference object and is reflected therefrom, collecting reflected beams reflected from the remote object and from the reference object with the photodetector, and mixing the reflected beams at the photodetector. The photodetector provides an oscillating response signal. The key indicator of the remote object is calculated.

One or more of the following features may be included. The key indicator of the remote object may be distance, velocity, topography, composition, and/or combinations thereof.

The wavelength tuning function may be a staircase function, a sloped staircase function, a linear function, and an arbitrary superposition of the staircase function, the sloped staircase function, and the linear function.

An oscillation frequency of the oscillating response signal may be a periodic function in time defined by (i) a period being a time between two mode-hops of the laser; and (ii) a duty cycle defined by a relative amplitude of a Fourier transform of the oscillating response signal and the two beat frequencies present in the Fourier transform of the oscillating response signal.

The periodic function of the oscillation frequency, the wavelength tuning function, and distance to the reference object may be used to calculate the key indicator of at least one of (i) a distance to at least one point of the remote object from the laser-based system and (ii) a velocity of at least one point of the remote object with respect to the laser-based system.

A chemical composition of a medium disposed between the laser and the remote object may be analyzed by calculating a total optical path of the remote object through the medium by using the calculated distance and velocity values of the remote object with respect to the laser-based system. Spectroscopic analysis of the reflected return optical beam may be performed by tunable laser absorption spectroscopy of the medium. Elemental contributions of a plurality of molecules due to molecule-specific ro-vibrational molecular absorption may be determined.

At least one key indicator may be used to form an object specific security key. Calculating the at least one key indicator may include using a 2D raster scan.

A plurality of key indicators may be calculated, the key indicators including at least one of a distance of at least one point of the remote object from the laser-based system, a velocity of at least one point of the remote object with respect to the laser-based system, a molecular composition of the remote object, a molecular composition of a medium disposed between the remote object and the laser-based system, and/or combinations thereof.

An object-specific multi-dimensional image of the remote object may be formed, wherein (i) dimensions of the image include at least one of a spatial appearance of the remote object, a velocity of the remote object, chemical composition of the remote object, or combinations thereof and (ii) the object specific security key includes the object-specific multi-dimensional image of the remote object.

BRIEF DESCRIPTION OF DRAWINGS

FIG. 2a is a reflection spectrum of a GaAs/AlGaAs distributed Bragg reflector and FIG. 2b is a reflection spectrum of $Si/SiO_2$ distributed Bragg reflector with a cavity defect.

FIGS. 4a and 4b are schematic diagrams of integrated hybrid III-V/IV widely tunable lasers based on Vernier filter tuning mechanism, based on coupled micro-ring resonators and a broadband reflector (FIG. 4a), and a modified WTL containing a wavelength shift tracking device in the form of non-balanced interferometer (FIG. 4b), in accordance with embodiments of the invention.

FIG. 14a is a schematic diagram and FIGS. 14b-14e are graphs illustrating the principle of operation of a conventional FMCW.

FIG. 16a is a schematic diagram and FIGS. 16b-16e are graphs illustrating a mode-hopping FMCW LIDAR with a sloped wavelength tuning function, in accordance with embodiments of the invention.

FIG. 17a is a schematic diagram and FIGS. 17b-17e are graphs illustrating a mode-hopping FMCW LIDAR for determining the velocity of a remote object with respect to the laser-based system, in accordance with embodiments of the invention.

DETAILED DESCRIPTION

Embodiments of the invention relate to wavelength control of widely tunable lasers during operation and enable calibration of the laser system without the need for external optical elements. The described method uses a periodic optical structure such as distributed Bragg reflector (DBR), distributed feedback grating (DFB) or any resonant optical cavity (ROC) that can be formed using resonators with periodic cavity mirrors such as DBR or DFB, or that use coupled resonators such as micro ring resonators (MRR), race track resonators, etc. In an embodiment in which a solid-state etalon provides a narrow band output, the absolute wavelength calibration of a widely tunable laser is used in combination with a wavelength shift tracking device, such as a non-balanced interferometer. Examples of a suitable non-balanced interferometer include, e.g., a Mach-Zehnder interferometer, a multi mode interference device, a Michelson interferometer, etc.

The described methods are applicable to both monolithic and non-monolithic widely tunable laser architectures. For clarity, the two architectures are discussed separately. Knowledge of the absolute wavelength is necessary for both architectures to ensure use in applications such as spectroscopy, wavelength division multiplexing, etc., without the use of external instruments and need for recalibration.

Non-monolithic widely tunable lasers typically involve a semiconductor optical element—a gain-chip—embedded in an external cavity configuration, and called external cavity diode lasers (ECDL). ECDLs can be realized in different ways, most typically involving a semiconductor gain-chip and a plurality of free-space optical elements configured in either a Littrow configuration or a Metcalf-Littman configuration.

Figure 1:
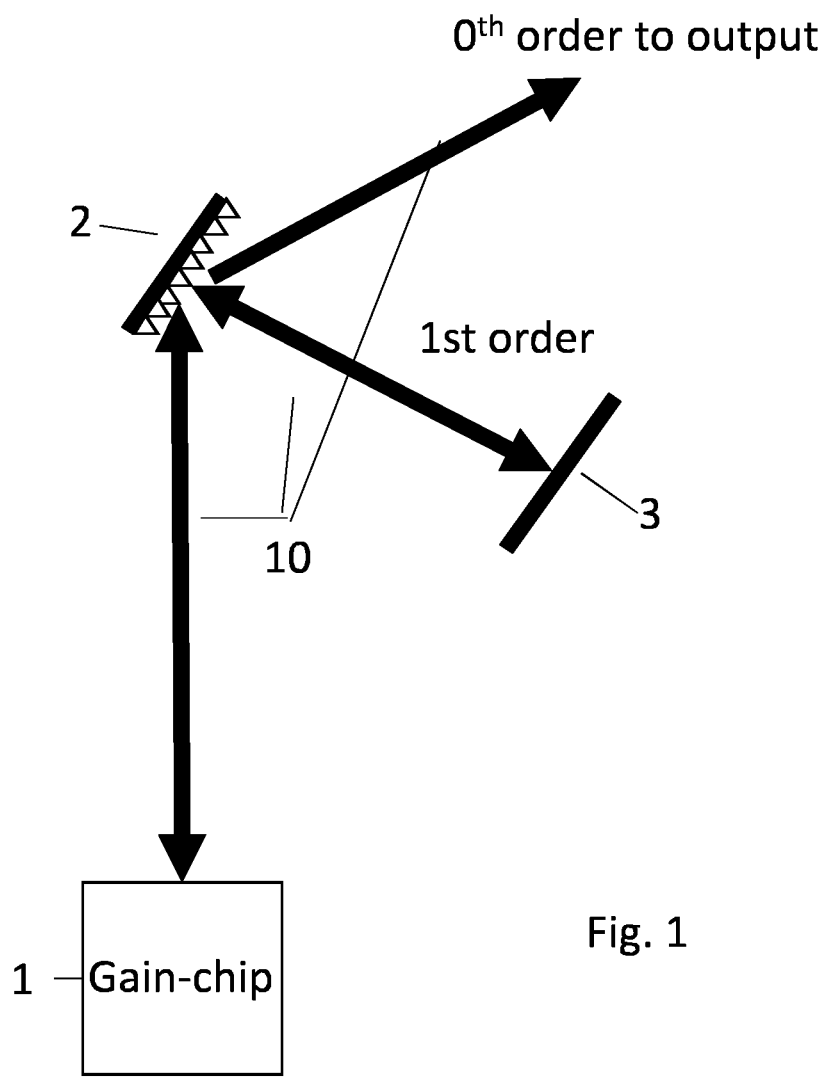
FIG. 1 is a schematic diagram illustrating an external cavity diode laser in a Metcalf-Littman configuration, in accordance with the prior art.

A simple schematic of a prior art Metcalf-Littman configuration is shown in FIG. 1. Here the semiconductor gain-chip 1 emits light that is collimated and follows the beam path 10 and hits the diffraction grating 2 at a grazing incidence angle. The $0^{th}$ order beam is directed to the output and the $1^{st}$ order beam is reflected onto a movable/rotating mirror 3, which reflects the light back onto the grating and back into the semiconductor gain-chip which amplifies the filtered signal and sends it to the output. In this configuration, wavelength control is achieved by the mirror rotation around a virtual pivot point axis. The angle of rotation defines the wavelength in the cavity, which is selected by the grating and the gain-bandwidth of the semiconductor gain-chip. In real systems, the mirror is rotated using mechanical motors, piezo elements or Galvano-magnetic MEMS mirrors. In all cases, the emission wavelength is not known a priori, without measuring with external instruments and calibrating the rotation motor position, or Galvano-magnetic current value to particular wavelength. Such systems tend to be prone to drifts, deviations due to mechanical instabilities, and vibrations, and generally require recalibration from time to time. Different wavelength control methods have been demonstrated, such as gas cells, filters for frequency combs, Fabry-Perot cavities, etc.

Figure 2:
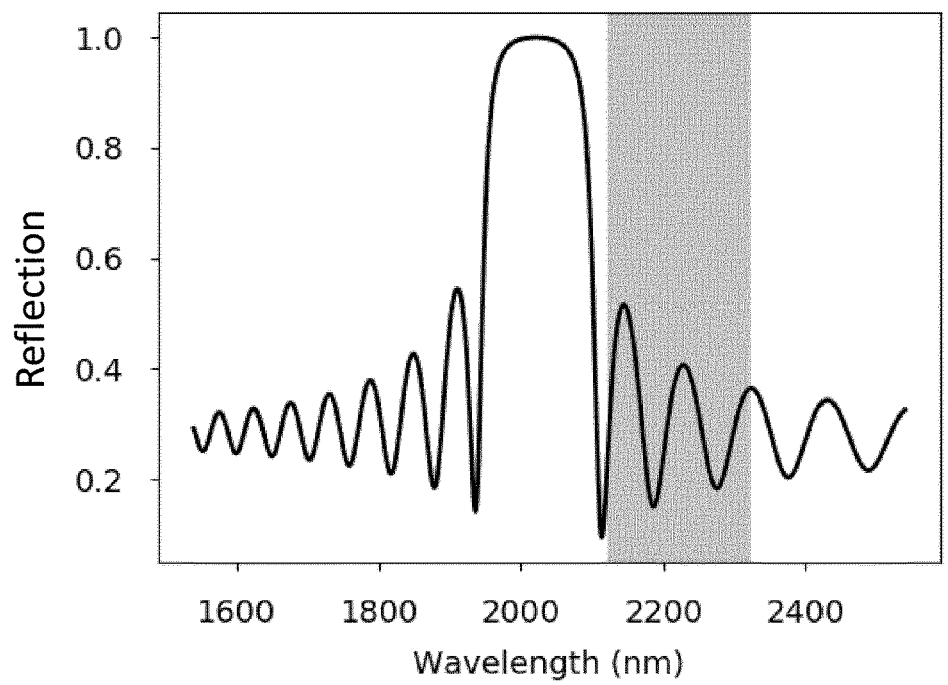
FIGS. 2a and 2b are representative unambiguous reflection and transmission spectra in the 2100 nm-2300 nm spectral region of selected solid state resonant cavity etalons with different refractive index contrasts. In particular.
Figure 2:
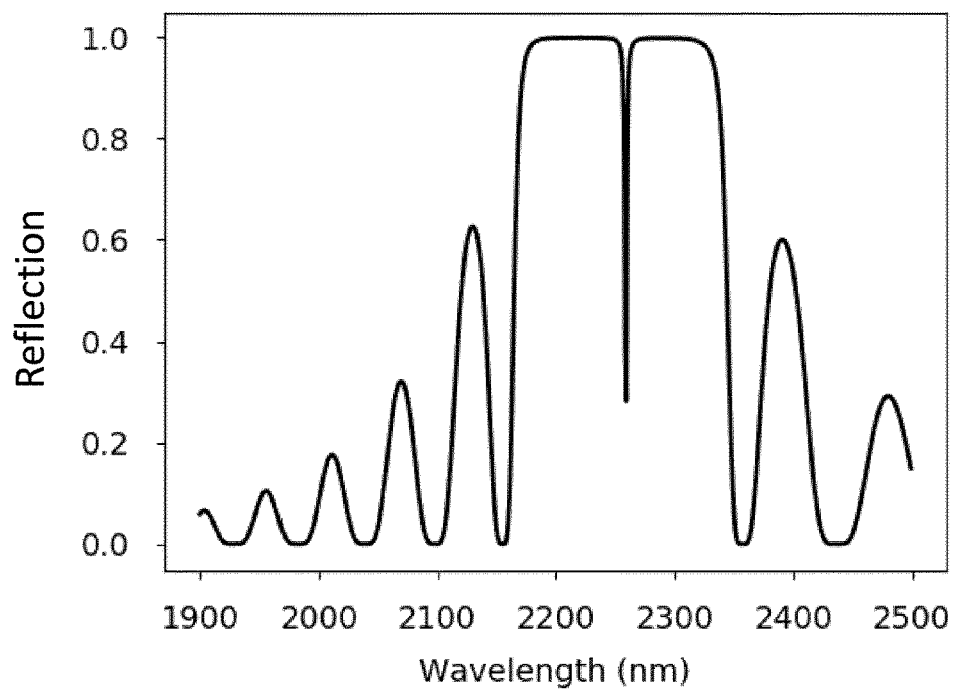

Embodiments of the invention include a periodic optical structure such as distributed Bragg mirror (DBR,) embedded in the beam path via a beam splitter and focused to a monitoring photodetector. The DBR can be designed to have a reflection band offset with reference to the tunable laser emission band (FIG. 2a) or designed with a cavity defect (FIG. 2b), providing a distinct and unambiguous transmission or reflection characteristic for the laser wavelength. The design of such structures is performed by depositing or growing epitaxial periodic pairs of materials with different refractive indices forming a periodic Bragg reflector. Changing the period and individual layer thickness results in changes in the Bragg wavelength and thus the transmission and reflection spectra. A typical DBR has a wide reflectance band around the Bragg wavelength as shown in FIG. 2a, which depicts an experimental GaAs/AlGaAs DBR reflection spectrum, designed around the Bragg wavelength, corresponding to ~2000 nm. A similar DBR structure designed in a high refractive index contrast material pair such as $Si/SiO_2$ is shown in FIG. 2b. Here the DBR structure also contains an embedded optical cavity, which results in a distinct sharp dip within the reflection spectrum of the DBR. Such specific spectral modulation due to the embedded cavity is strong only when the refractive index contrast is high, therefore DBR with optical cavity is a good choice for a solid-state wavelength etalon when $Si/SiO_2$ is used. In embodiments in which the refractive index contrast is low as in the GaAs/AlGaAs material system, the DBR can be designed so that its Bragg wavelength is offset with respect to the widely tunable laser emission, so that this emission spectrum overlaps with periodic modulation of the transmission/reflection at the side of the DBR reflection stopband, as shown in FIG. 2a.

Figure 3A:
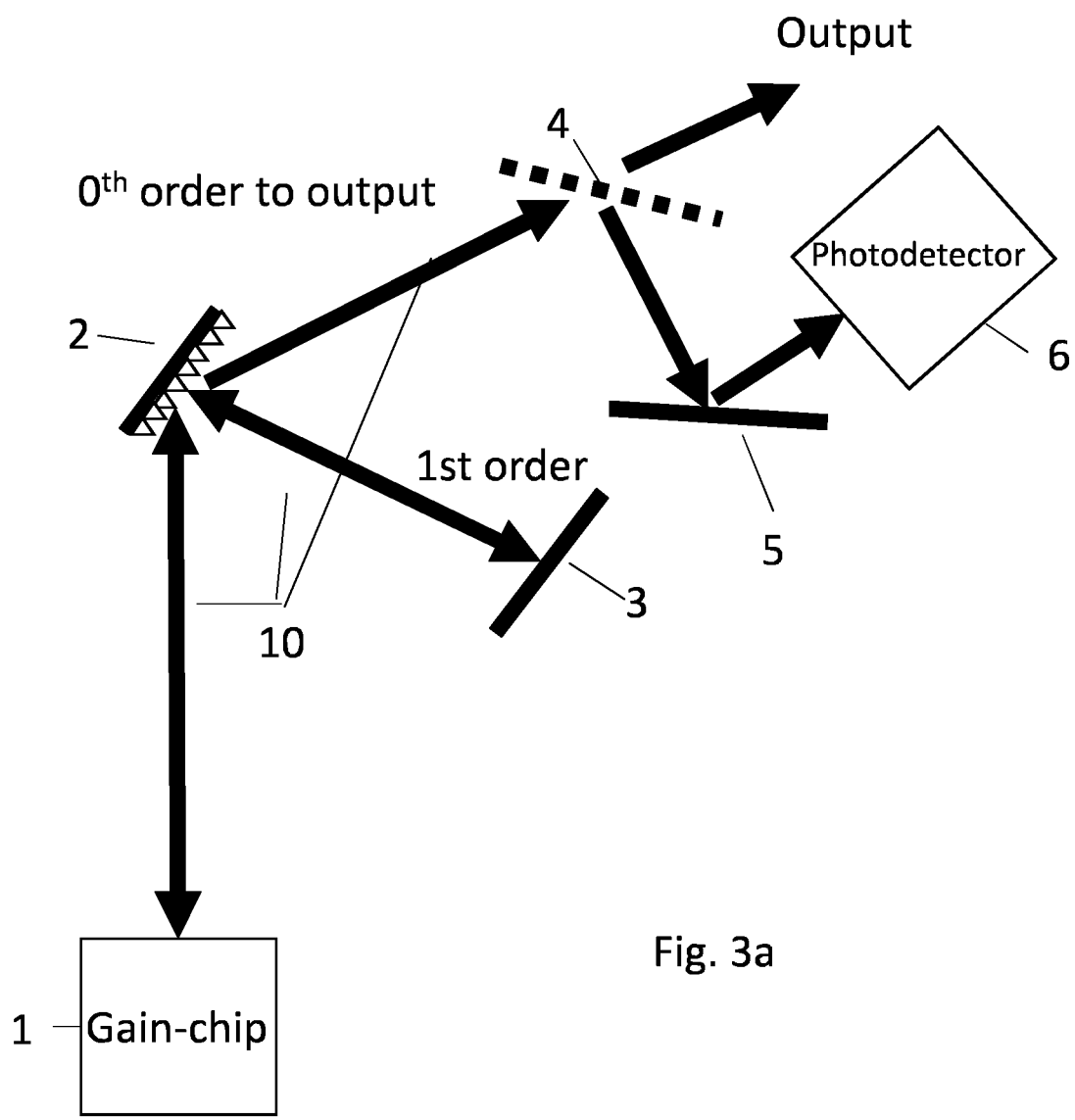
FIG. 3a is a schematic diagram of a modified external cavity diode laser (ECDL) with a solid state wavelength reference etalon in a reflection configuration, in accordance with an embodiment of the invention.

An ECDL configuration containing this type of periodic etalon is depicted in FIG. 3a. Here the beam splitter 4 splits a portion of the beam onto an etalon mirror 5, which is a periodic optical structure with an unambiguous reflection spectrum. Light reflected from the etalon mirror 5 is therefore modulated with the wavelength specific reflection/transmission function of the mirror, and is recorded as a time function with a single etalon photodetector 6. The etalon photodetector 6 may be, e.g., a bipolar diode device, or a unipolar device such as a barrier photodiode or a quantum well infrared photodetector (QWIP). Since the etalon mirror 5 is formed by stacking periodic structures of two materials with different refractive indices, it is important to compensate for temperature drift. This is easily achieved by including a thermopile (not shown) on the etalon mirror 5, which allows the evaluation of the reflection/transmission function shift with temperature, which is a known function, or the maintenance of the etalon at a constant temperature via individual temperature stabilization using a thermoelectric cooler/heater.

Figure 3B:
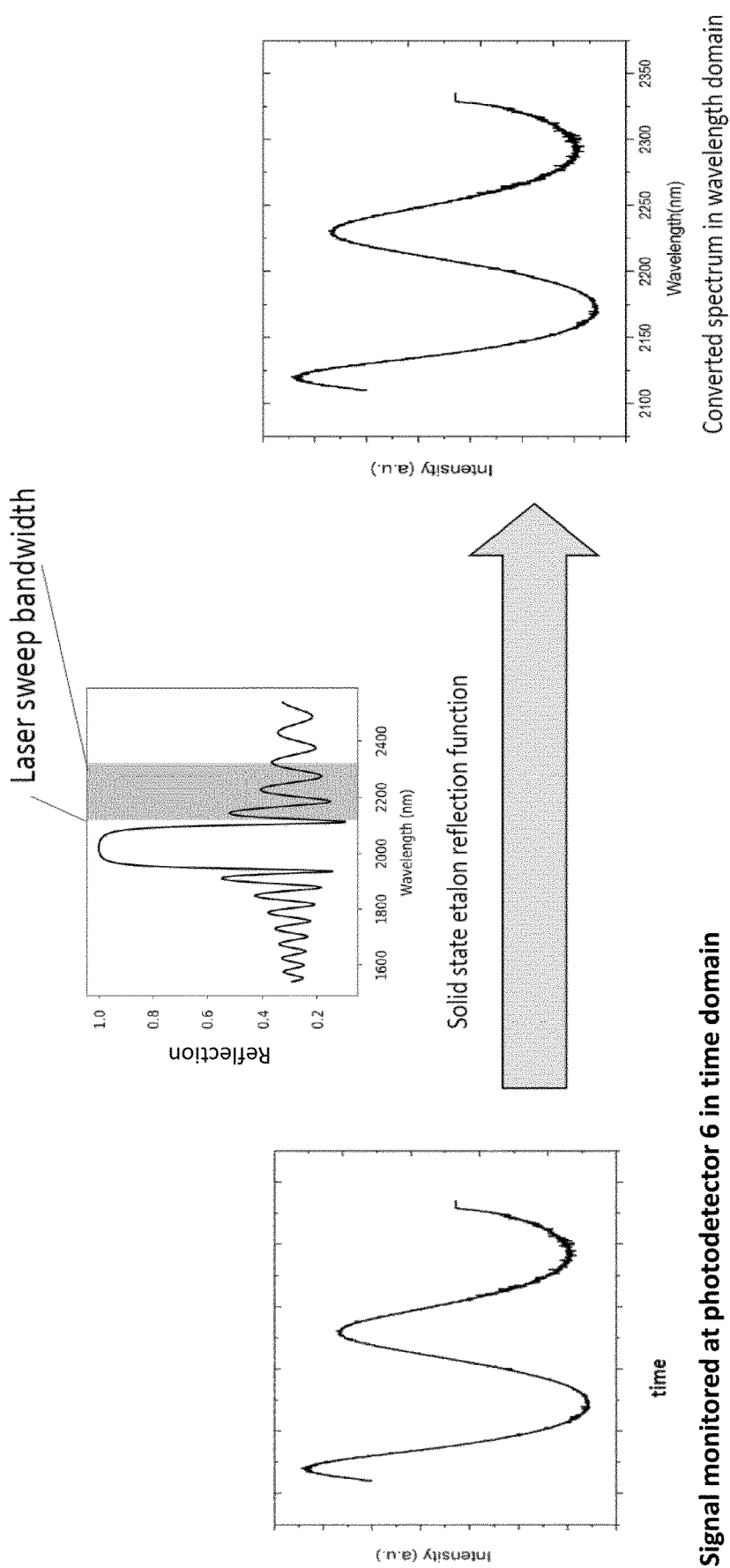
FIG. 3b illustrates a time domain signal conversion into wavelength domain, in accordance with an embodiment of the invention.

FIG. 3b depicts the transformation of a time domain signal recorded by the photodetector 6 into a spectral domain using a solid state etalon such as an offset DBR depicted in FIG. 3b. To provide the unambiguous spectral modulation, the DBR center wavelength may be offset with reference to the center of the gain curve of the semiconductor gain-chip. One can see a clear modulation recorded with the etalon photodetector 6.

Referring again to FIG. 2a, the same modulation function can be seen, which is a measured reflection spectrum of the reference DBR mirror alone. Such curves allows absolute wavelength calibration for the ECDL through monitoring the time signal at the etalon photodetector 6 without the use of additional external instrumentation, given that the unambiguous reflection or transmission pattern of the solid state etalon is known for a spectral region that matches the laser tuning spectrum and the grating rotation or the MEMS mirror movement is at constant velocity. The latter condition is difficult to fulfil, as sweeping the grating rotation or MEMS mirror deflection causes an acceleration period when the sweep is initiated and deceleration when the sweep ends. This leads to a nonlinear distortion of wavelength as a function of time, making auto calibration impossible. This may be overcome by using a wavelength shift tracking device, which provides wavelength shift value as a function of time, allowing the recording of nonlinearities due to transitional effects and taking them into account.

Figure 3C:
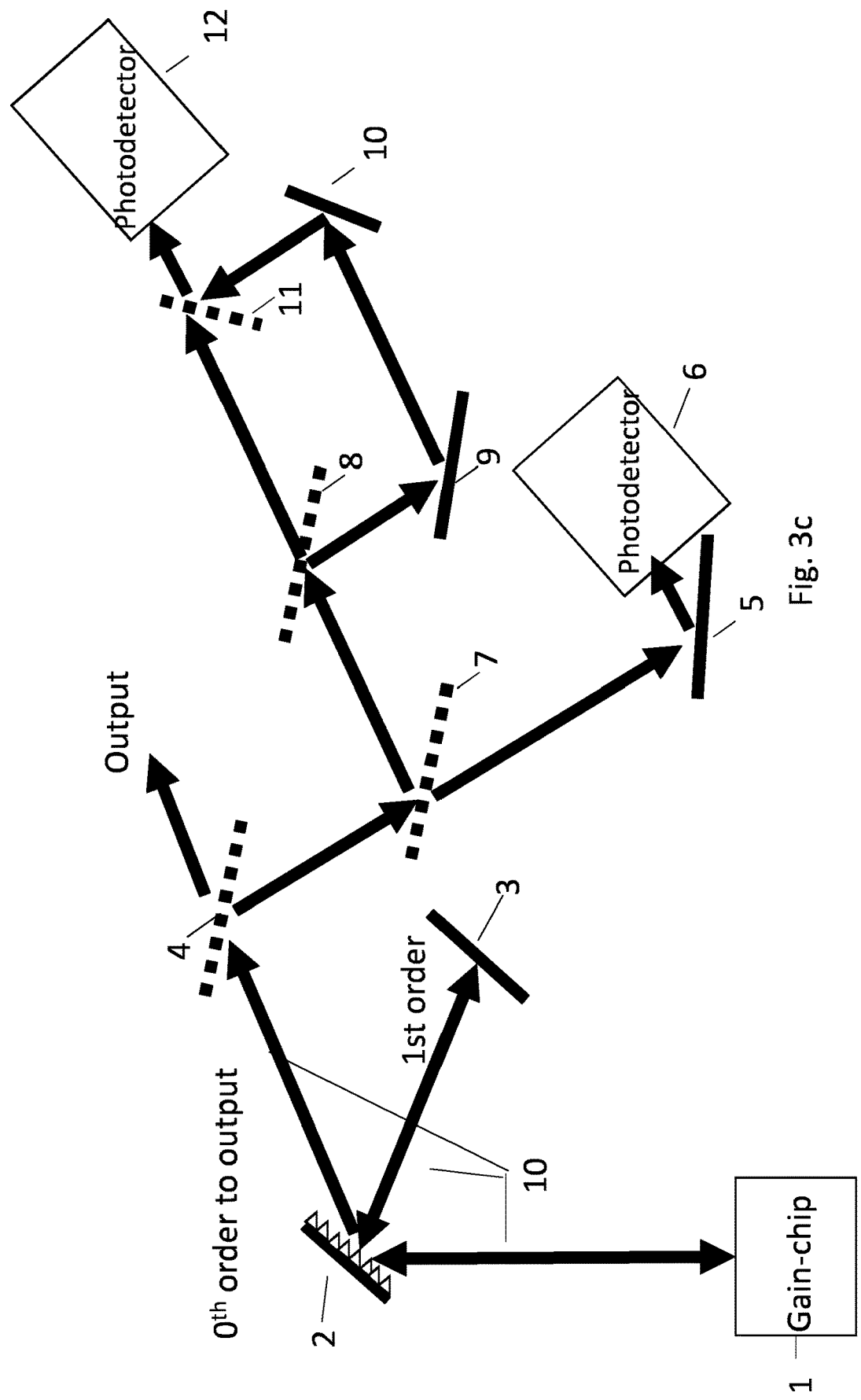
FIG. 3c is a schematic diagram of an optimized external cavity diode laser including a solid-state wavelength reference etalon and a wavelength shift tracking device in the form of a non-balanced interferometer, in accordance with an embodiment of the invention.

In an embodiment in which the solid state etalon has a narrow band output, such as a resonant optical cavity or a filter, or an unambiguous output such as offset DBR, wavelength calibration across the entire sweep can be done using the solid state etalon in combination with a wavelength shift tracking device such as a non-balanced interferometer as shown in FIG. 3c. Here, the output beam from the ECDL laser is split in two parts by a beamsplitter 4. One portion is the output of the widely tunable laser system and the other portion of the beam is further divided by a second beamsplitter 7, with one part of the beam entering the non-balanced interferometer that includes two beamsplitters 8, 11 and two mirrors 9, 10. The beamsplitter 7 is non-balanced because the optical path length through the upper arm which goes through the two beamsplitters 8, 11 is shorter than the lower arm where the light is passed through the two mirrors 9, 10. This provides an interfering optical signal at the output of the interferometer where the optical signals from the two arms are again combined. The oscillating signal can be monitored with a second photodetector 12 at any of the outputs of beam splitter 11. The oscillating function recorded by the second photodetector 12 has an oscillation period defined by the optical path difference between the interferometer arms, which is known and defined by design. Thus the absolute wavelength shift can be traced real-time. Once the etalon photodetector 6 associated with the solid state etalon 5 records and determines the absolute wavelength specific output from the etalon, this value in combination with the absolute wavelength shift value recorded by the second photodetector 12 allows calibration of the entire tuning curve. Such an etalon and wavelength shift tracking device can be applied to both monolithic and hybridly or heterogeneously integrated widely tunable lasers.

FIG. 3c depicts only one way amongst many of how a non-balanced interferometer can be realized, as is known to those skilled in the art. While addition of the wavelength shift tracking device and solid state etalon adds complexity in terms of components for bench top discrete widely tunable lasers based on ECDL technology, the described embodiment is particularly useful for integrated widely tunable lasers realized by a hybrid combination of III-V gain chip and the photonic integrated circuit within the same chip.

The most common way to design a widely tunable laser (WTL) within semiconductor chips is using Vernier-filter effect, which utilizes two coupled resonators with slightly different free spectral ranges. Each of the resonators provides a frequency comb, with a lasing frequency being one where two frequency combs overlap. The lasing frequency can be quickly changed (tuned) by changing the effective refractive index of one of the resonators. A Vernier-filter can be realized using sampled Bragg grating, superstructure grating, or coupled micro-ring resonators (MRRs).

FIG. 4a is a schematic diagram of a hybrid III-V/silicon widely tunable laser (WTL) with two coupled MRRs. The solid-state gain medium based WTL for emitting light may be realized using a semiconductor gain chip 1 coupled to a photonic integrated circuit in which light is guided through waveguide structures 20. The solid state gain medium may include a III-V semiconductor based gain chip, with the III-V semiconductor including, e.g., Al, Ga, In, As, Sb, P, N, Bi, and alloy combinations thereof. The photonic integrated circuit may be based on silicon-on-insulator, silicon nitride or germanium-on-insulator and other material platforms.

The light is coupled to a double-MRR-based Vernier-filter 30, 31, and a broadband reflector 40. Wavelength tuning is achieved by thermally changing the refractive index of the MRRs by heaters 50, 55. In this manner it is possible to rapidly sweep the wavelength across the entire available gain-bandwidth of the III-V gain-chip. However, in this configuration, while the gain-bandwidth of the semiconductor gain-chip is known to a certain extent, the exact wavelength shift and absolute emission wavelength cannot be determined without external instrumentation.

Figure 4B:
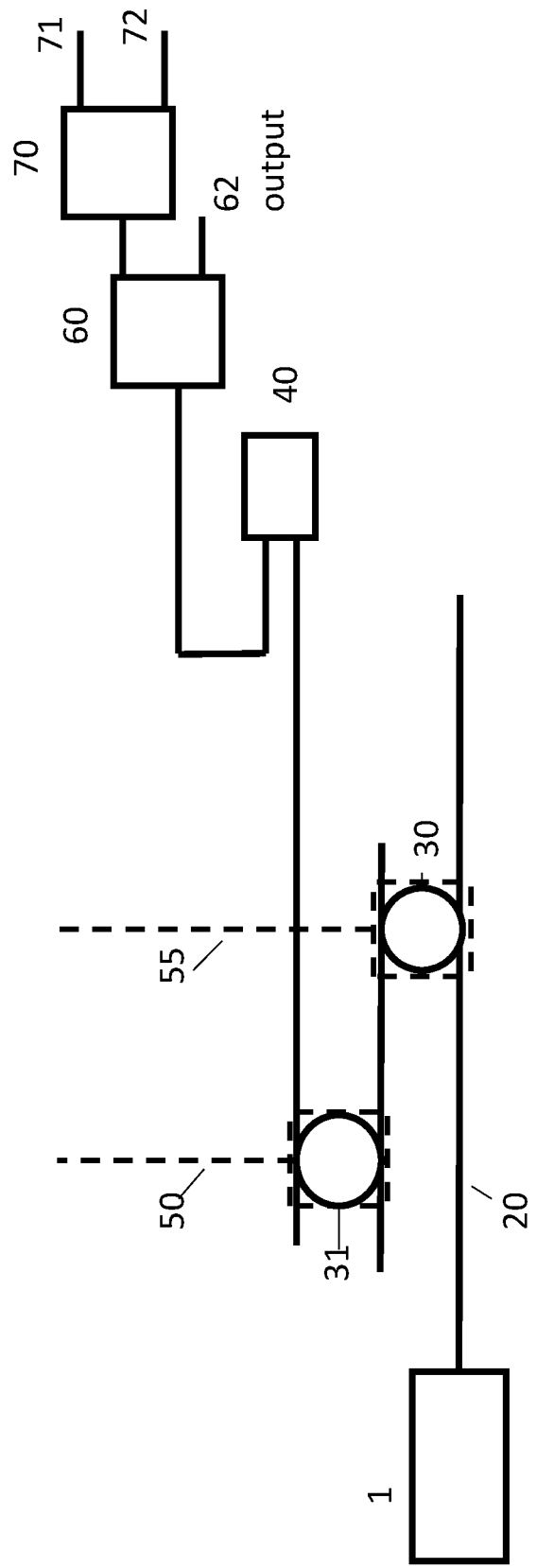

A non-balanced interferometer, such as a non-balanced 1×2 Mach-Zehnder interferometer may be added to the WTL to provide an oscillating output as a function of wavelength at both output arms acting as a wavelength shift tracking device. This structure allows precise tracking of the wavelength tuning magnitude with a resolution that depends on the optical path difference between the two interferometer arms, as shown in FIG. 4b. Here, the output signal of the WTL is routed to a 1×2 MZI 60, which acts as a beam splitter, and splits part of the beam to the output 62 of the system. The other part of the beam is a reference signal that is sent through a non-balanced MZI 70, which provides a wavelength specific transmission function allowing wavelength shift tracking through two outputs 71, 72. In principle, monitoring one of the two outputs is sufficient to access the wavelength shift information. Monitoring both outputs is beneficial in terms of better accuracy and higher signal-to-noise ratio.

While allowing tracking of the wavelength shift, this structure alone does not provide information about the value of the actual emission wavelength. In certain cases, such as spectroscopy of some samples that have distinct, a priori known spectral shapes, a Vernier-filter based laser with a 1×2 non-balanced MZI can also provide absolute wavelength value, at the cost of additional signal processing and control algorithm.

This shortcoming may be resolved by adding a solid-state etalon in a similar way as for the discrete ECDL based widely tunable lasers including a resonant optical cavity (ROC) with a defect in combination with the WTL and the wavelength tracking device. The ROC can be a DBR, DFB, MRR or other type of resonant optical cavity with a clearly defined wavelength specific transmission/reflection spectrum. An example of a DBR baser ROC reflection spectrum is shown in FIG. 2b where a clear cavity dip can be seen in the center of the stop-band. This cavity dip can be used to wavelength calibrate the WTL. If, for the discrete widely tunable lasers, the DBR is designed as a discrete component, it can also be realized by using photonic integrated circuit technology, by periodic etch of a Si, SiN or Ge waveguide. The period and index contrast defining the transmission and reflection properties as shown in FIG. 2b. Since periodicity is defined in terms of refractive index variation, this can be accomplished in many different ways as known to the ones skilled in the art, e.g., fully etched gratings, partially etched (shallow) gratings, corrugated sidewall gratings, photonic crystal gratings, side gratings, etc.

Figure 5A:
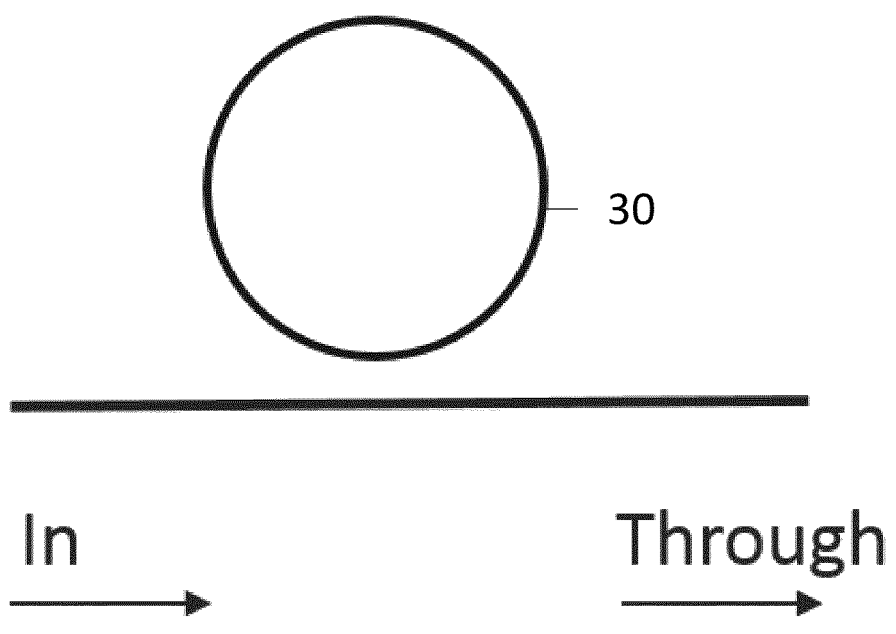
FIG. 5a is a schematic diagram of a resonant optical cavity in the form of a coupled micro-ring resonator, in accordance with an embodiment of the invention.
Figure 5B:
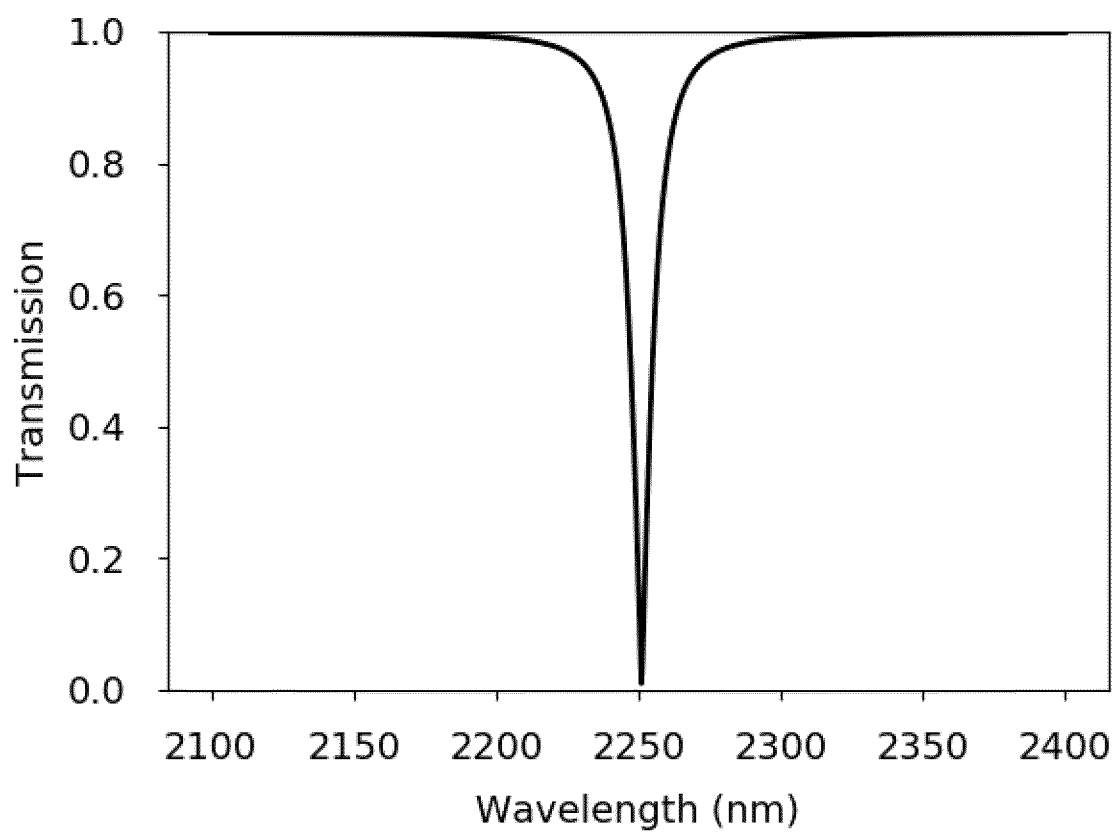
FIG. 5b is a corresponding transmission spectrum of the coupled micro-ring resonator of FIG. 5a, illustrating possible function as a solid-state-etalon, in accordance with embodiments of the invention.

Referring to FIGS. 5a and 5b, transmission through an ROC-based on MRR 30 has a characteristic resonant dip, due to the resonant ring cavity coupled to the bus waveguide.

Figure 6:
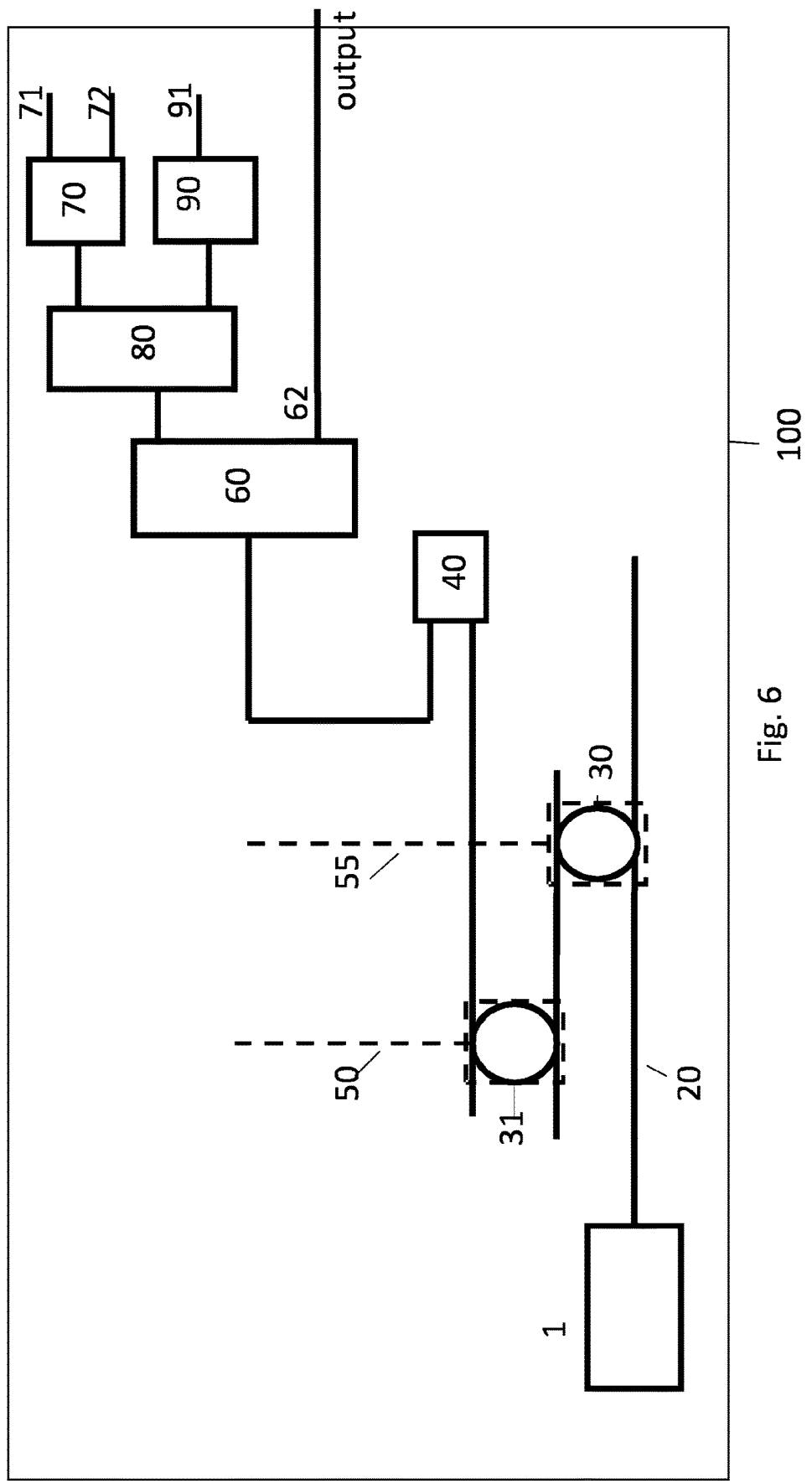
FIG. 6 is a schematic diagram of an optimized hybrid III-V/IV widely tunable laser including a wavelength shift tracking device and a wavelength reference etalon in the form of a resonant-optical-cavity enabling complete auto-calibration within one sweep, in accordance with an embodiment of the invention.

A way to implement such an ROC in photonic integrated circuitry is shown in FIG. 6. Here, the WTL is realized using a semiconductor gain chip 1, coupled to a photonic integrated circuit, where light is guided through waveguide structures 20. The light is coupled to a Vernier filter based on two MRRs 30, 31, and a broadband reflector 40. Wavelength tuning is achieved by thermally changing the refractive index of the MRRs by the heaters 50 and 55. The output signal is then routed to a 1×2 MZI 60 which acts as a beam splitter. The 1×2 MZI 60 splits the optical signal into the output beam and the reference signal. The reference signal is routed to an additional 1×2 MZI beam splitter 80, the output ports of which connect to a non-balanced MZI wavelength tracking device 70 used for wavelength shift tracking and to ROC etalon 90, which is used, through output port 91, for absolute wavelength calibration.

The photodetector at the output port 91 of the solid-state based etalon 90 cooperates with at least one photodetector at the outputs 71, 72 of the MZI wavelength tracking device 70 to provide absolute wavelength determination and control of the widely tunable laser, thereby enabling absolute wavelength sweep calibration within the sweep. Depending on the solid state etalon configuration, the photodetector at the output 91 reads a high or a low when the laser tunes to the reference wavelength of the etalon. This signal combined with the time function recorder at the outputs of the wavelength shift tracking device 70 allows reconstruction of the entire wavelength tuning function. The wavelength tuning function is the way the wavelength changes as a function of time due to external drive signal such as tuning current, mirror deflection, grating rotation angle, etc. The wavelength tuning function of the laser during the sweep depends on the laser system design and can be linear or, as in most cases, non-linear and follow any arbitrary mathematical function. The transitional effects, such as wavelength shift not being a constant time function, result in change of the period at the output of the wavelength shift tracking device 70. Thus all nonlinearities within the sweep can be reconstructed once the absolute wavelength reference signal is recorded, and thus the entire wavelength tuning function can be reconstructed including all nonlinearities off the system.

Figure 7A:
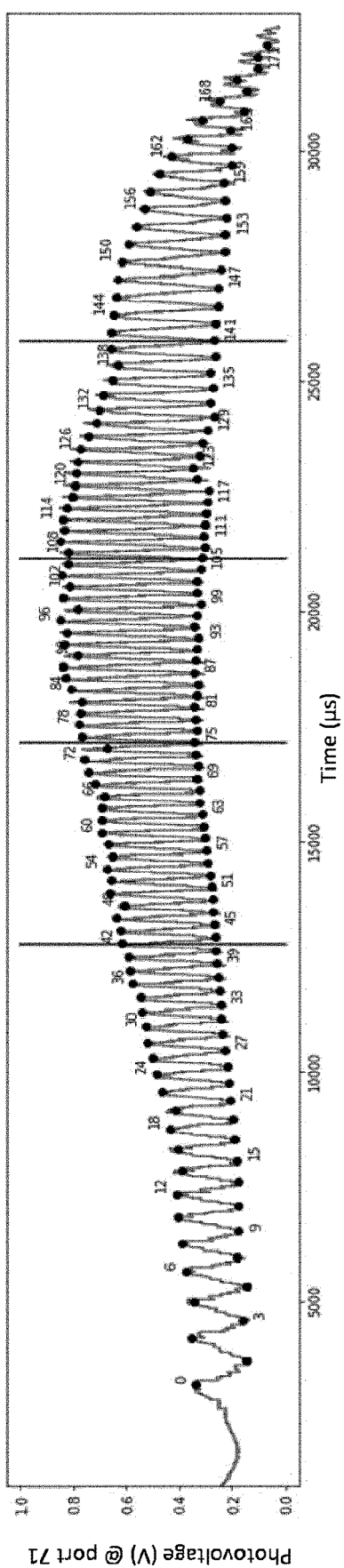
FIG. 7a is a graph of experimental time-domain signals as monitored by the photodetector at the output port of a non-balanced interferometer, in accordance with an embodiment of the invention.
Figure 7B:
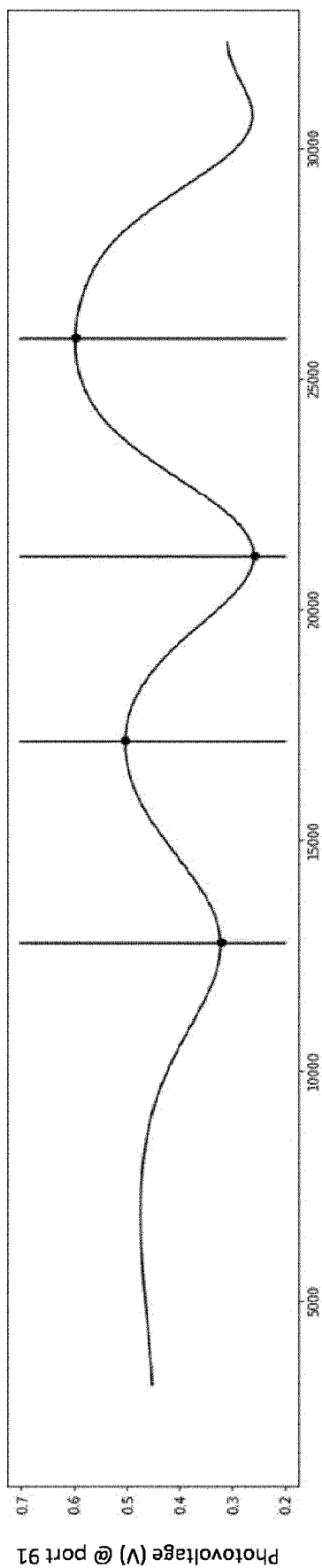
FIG. 7b is a graph of a time-domain signal measured with a photodetector at the output port of a solid-state etalon, in accordance with an embodiment of the invention.
Figure 8A:
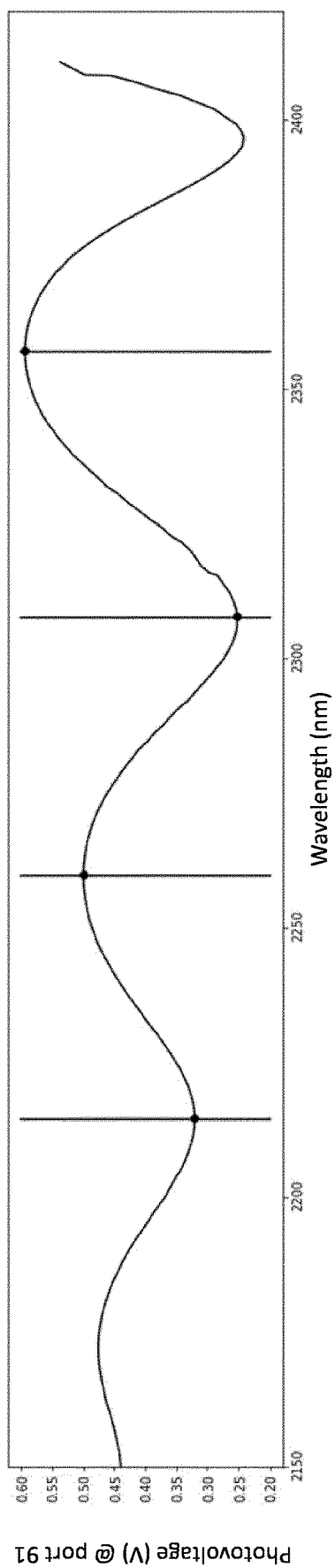
FIG. 8a is a graph of the conversion of the time-domain signal into the wavelength-domain using the known function of a solid-state etalon that is an offset DBR, in accordance with an embodiment of the invention.
Figure 8B:
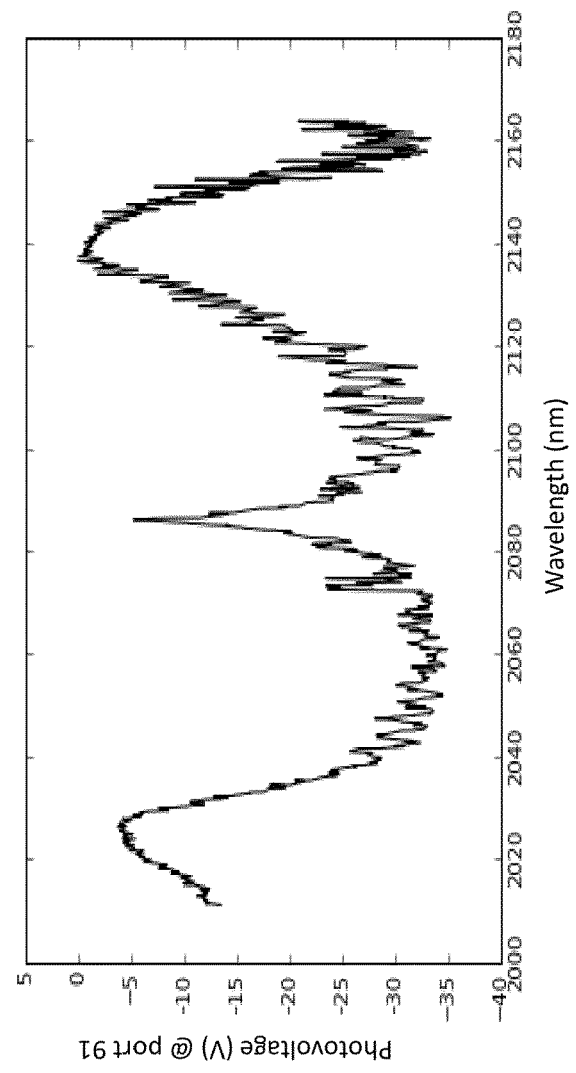
FIG. 8b is a graph of the experimental transmission measurement at a port of another solid-state etalon with a cavity defect, in accordance with an embodiment of the invention.
Figures 8C, 8D:
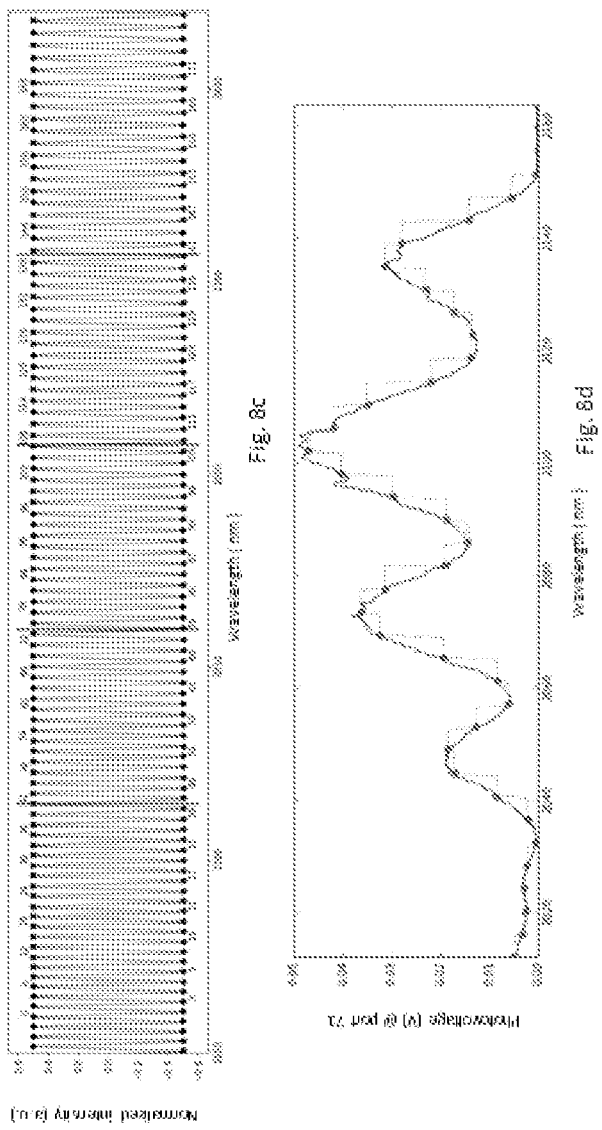
FIGS. 8c and 8d are graphs showing the use of the information of FIG. 8a to calibrate the time-domain signal of a non-balanced interferometer photodetector at a different port, in accordance with embodiments of the invention for two different experimental widely tunable lasers.
Figure 9A:
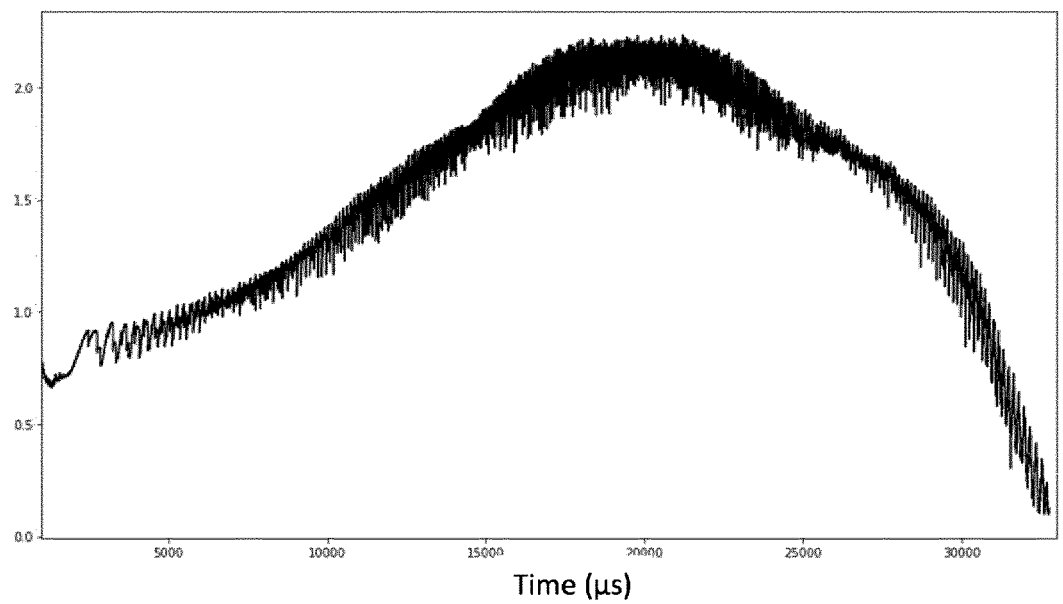
FIGS. 9a and 9b are graphs of experimental demonstrations of the calibration of the swept-wavelength laser tuning curve, in accordance with embodiments of the invention.
Figure 9B:
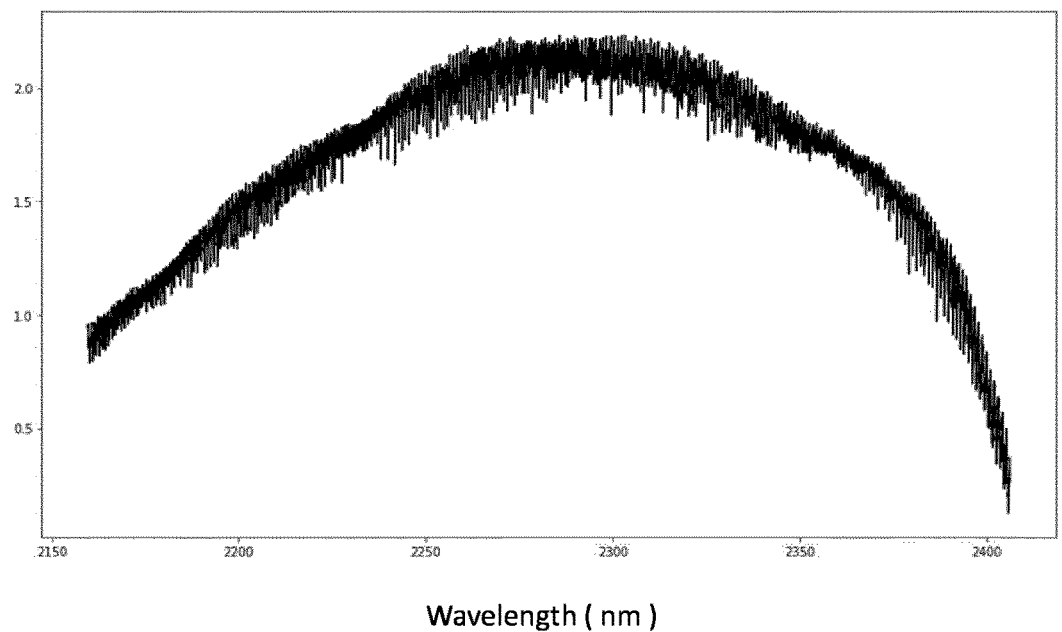

FIG. 7a depicts the time-domain signal as recorded by a photodetector at an output port 71, 72 of the non-balanced interferometer, and FIG. 7b depicts the time-domain signal measured with a photodetector associated with the output port 91 of the solid state etalon. The time-domain signal recorded at output port 91 is known and therefore can be converted to wavelength or frequency domain as shown in FIG. 8a or 8b for two different solid state etalons. This information may then be used to calibrate the time-domain signal recorded with photodetector at a non-balanced interferometer output port 71, 72 and converted to the wavelength or frequency domain as shown in FIGS. 8c and 8d respectively. This information carries calibrated wavelength-domain information about absolute wavelength value and wavelength shift magnitude at any moment within the sweep, and thus allows complete reconstruction of an arbitrarily nonlinear wavelength tuning function of the sweep as shown in FIGS. 9a and 9b, and calibration of the wavelength tuning function of the laser.

In operation, light emitted by the WTL is used to perform a wavelength sweep by means of, e.g., electro thermal tuning of at least one of the coupled resonators 30, 31 forming the Vernier filter. At least one photodetector at one of the outputs 71, 72 of the wavelength shift tracking device 70 tracks and records an oscillating signal in time domain, i.e., a wavelength shift of the emitted light, as the wavelength sweeps. In parallel, at least one photodetector 91 at the output of the solid-state etalon 90 records absolute wavelength values of the emitted light. At a certain moment within the sweep the WTL wavelength sweeps across the reference wavelength of the solid-state etalon 90, providing a distinct signal reading for at least one photodetector at the output 91 of the solid state etalon 90, recording and determining the absolute wavelength value. This recorded wavelength shift value can then be used in combination with the reference of an absolute wavelength value recorded with the solid-state etalon to calibrate the entire wavelength tuning function of the WTL as is demonstrated in FIGS. 9a and 9b.

The above described method and architecture allows precise absolute wavelength determination and tracking that can be achieved during one wavelength sweep, thereby allowing auto-calibration of the wavelength tuning function of the laser and system thereof without use of external instrumentation. Moreover, the described embodiments may be thermally stable, as the system temperature may be monitored by, e.g., an integrated thermopile and providing constant temperature for the solid state etalon by means of thermoelectric temperature control.

The architecture and methods described herein enable a very wide range of applications, which include spectroscopic biosensing—i.e., blood constituent (glucose, urea, lactate, serum albumin and other) concentration determination, coherent LIDAR for autonomous vehicles, security, industrial in-line inspection and remote sensing, facial recognition, etc.

Figure 10:
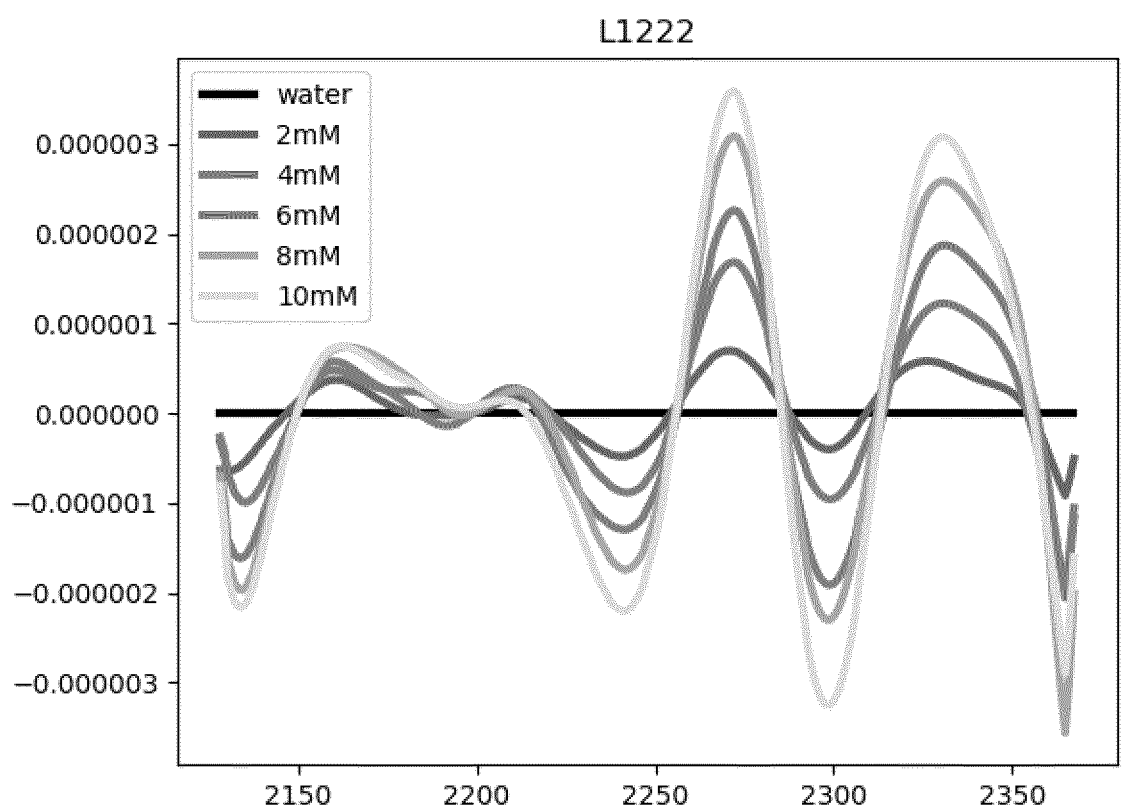
FIG. 10 is a graph illustrating experimental second-order derivatives of transmittance spectrum for different glucose concentrations, in accordance with an embodiment of the invention.

In spectroscopic biosensing applications, a widely tunable laser source is a key component of the sensor chip as light absorption is a result of light-molecule interaction and is molecule specific. Depending on the spectral region, molecule-specific overtone and fundamental absorption bands due to, for example, C—H stretching or a combination of C—H, O—H and N—H stretching and bending vibrations can be identified and allow both the identification of the molecule of interest and its concentration. While in the gas-phase, the absorption bands are very narrow (typically hundred MHz), widely tunable laser are particularly interesting for multi-molecule sensing as they can cover the absorption bands of multiple molecules. In liquid phase the molecular absorption bands are spectrally broad due to collisions and typically span 100 nm or more. Therefore, the laser needs to be tuned across a very wide wavelength range in order to grasp the molecule specific spectrum. Experimental second-order derivative of the transmittance spectra for different glucose concentrations are shown in FIG. 10, obtained using a laser-based device in accordance with an embodiment of the invention. It can be seen that molecule-specific spectrum span more than 200 nm from 2150 nm to 2350 nm and beyond.

Figure 11A:
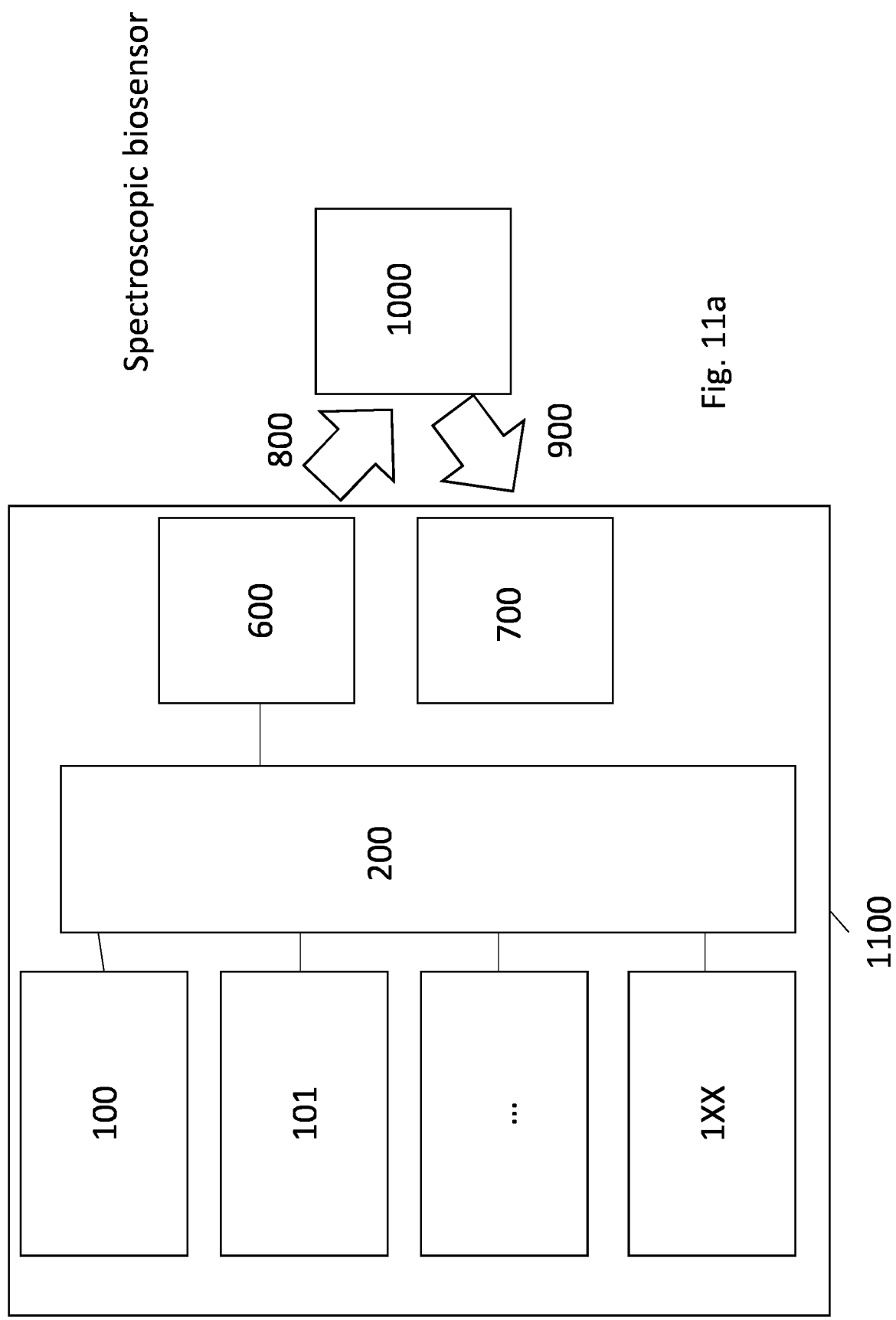
FIGS. 11a and 11b are schematic diagrams of spectroscopic sensors for biomolecule concentration sensing, in accordance with an embodiment of the invention.

A possible construction of a widely tunable laser based spectroscopic sensor 1100 is depicted in FIG. 11a. The spectroscopic sensor 1100 includes a widely tunable laser array 100, 101, 102, . . . 1XX, a beam combiner 200, which can be a single waveguide, multiple waveguide array, a multimode interference device, etc., output section 600, which may be formed with free space optics and/or fiber-optic interface which can be, e.g., a grating coupler, multiple grating couplers, phased array, an output mirror, or an end-fire waveguide, and a signal detection interface 700, which can be at least one photodetector. To perform spectroscopic sensing, the tunable laser radiation is emitted by the widely tunable laser array 100,101, . . . 1XX and directed to the beam combiner 200. The combined beam is then directed to the output section 600. The tunable laser light is then coupled onto a sample or target 1000 via the free-space beam or an optical fiber delivery 800. The sample or target 1000 may be an isolated drop of blood, or blood and interstitial fluid in the epidermis layer of the human. The light then interacts with the target molecule and part of the light is absorbed by the target molecule within the sample, modifying the spectrum of the light. This light is diffusely reflected back to the sensor via return beam 900 and collected via signal photodetector 700 and the photovoltage or photocurrent is converted into a concentration of a sample component.

Figure 11B:
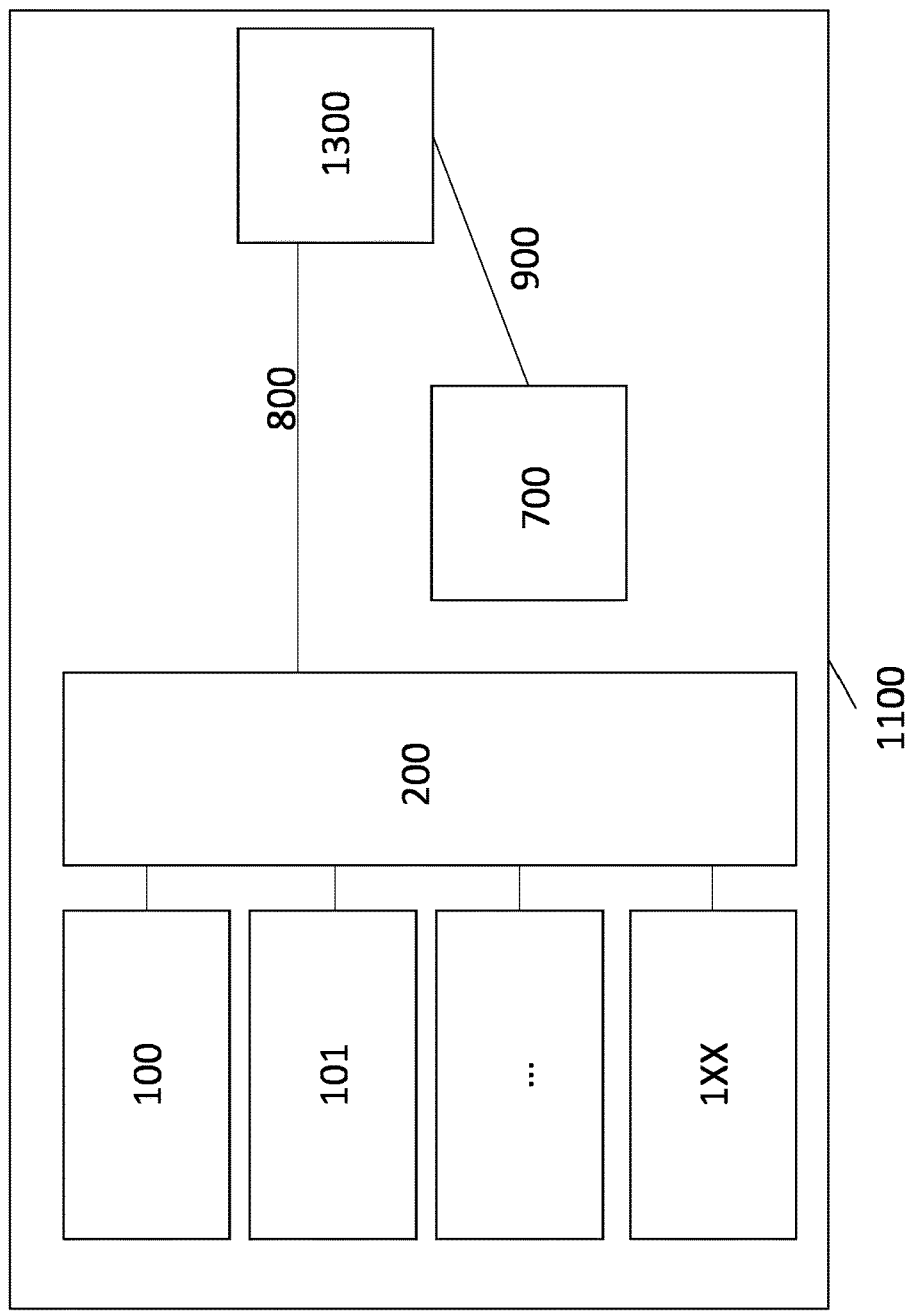

In FIG. 11b, the spectroscopic sensor 1100 also encompasses the interaction block 1300. Instead of coupling out of the sensor, the light is only brought in close proximity with the to-be-sensed environment. This interaction block 1300 may be a spiraled waveguide where the evanescent field just outside the waveguide senses the surroundings, a functionalized interface where molecule-specific receptors can cause a refractive index shift, an opto-acoustic component where the acoustics of the surrounding may be tested, etc. If an interaction block 1300 is used, no output section 600 is needed as the light does not leave the sensor.

Figure 12:
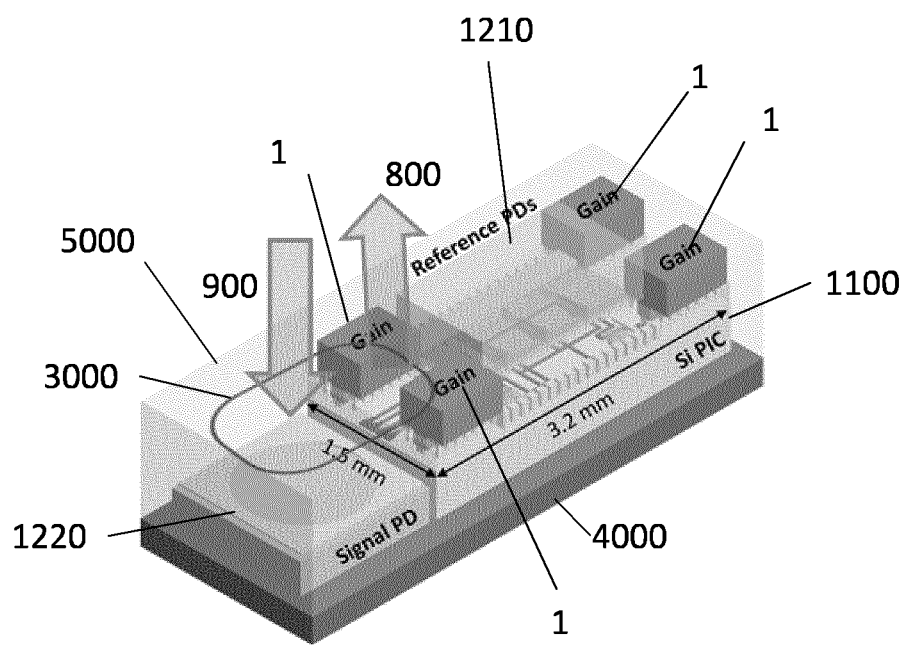
FIG. 12 is a schematic perspective view of a spectroscopic system on a chip, in accordance with an embodiment of the invention.

FIG. 12 depicts an example of an experimental realization of a spectroscopic sensor 1100 for blood analysis, as described herein. The sensor is based on photonic integrated circuit technology available in commercial CMOS foundries on 200 mm and 300 mm wafer sizes. The size of the physical sensor die is determined by the size of the III-V components—i.e., gain-chips and photodetectors. A compact version of the sensor 1100 may include 4 III-V gain-chips 1, a 1×4 reference photodetector array 1210 and a single signal photodetector 1220. The sensor size can be reduced by reducing the number of III-V components. In a particular embodiment in which only a single molecule is of interest, the bandwidth of a single III-V gain-chip may be sufficient, leading to an overall sensor size of a few mm$^2$. The compact size allows such a sensor 1100 to be easily integrated into handheld and wearable consumer electronic devices such as smart watches, smartphones or smart wristbands using conventional packaging technologies. Optical communication with the subject may be performed via an optical window 3000 realized, for example, on a top surface of encapsulation 5000. A free-space delivery 800 and return beam 900 are depicted. For ultimate compactness, the driver electronic circuits 4000 can be realized in the same silicon crystal underneath the photonic circuit, leading to a full 3D hybrid electro-photonic integrated circuit.

Apart from the size, the ability to realize the described sensors using a group-IV semiconductor technology platform (for example CMOS) provides the capability to scale manufacturing to fabricate many million units per year at a low cost. For example, consider a relatively large sensor with 4 III-V gain-chips and a 1×4 reference photodetector array as depicted in FIG. 12. Over 4000 such sensor chips may be formed on a single 200 mm Si wafer, with a standard production batch of 25 wafers yielding 100 000 sensor chips, resulting in a single sensor chip costing less than 10 US dollars. The described embodiments and their compatibility with large scale technology enable the inexpensive monitoring of critical metabolites without extra effort in real-time 24/7.

Figure 13:
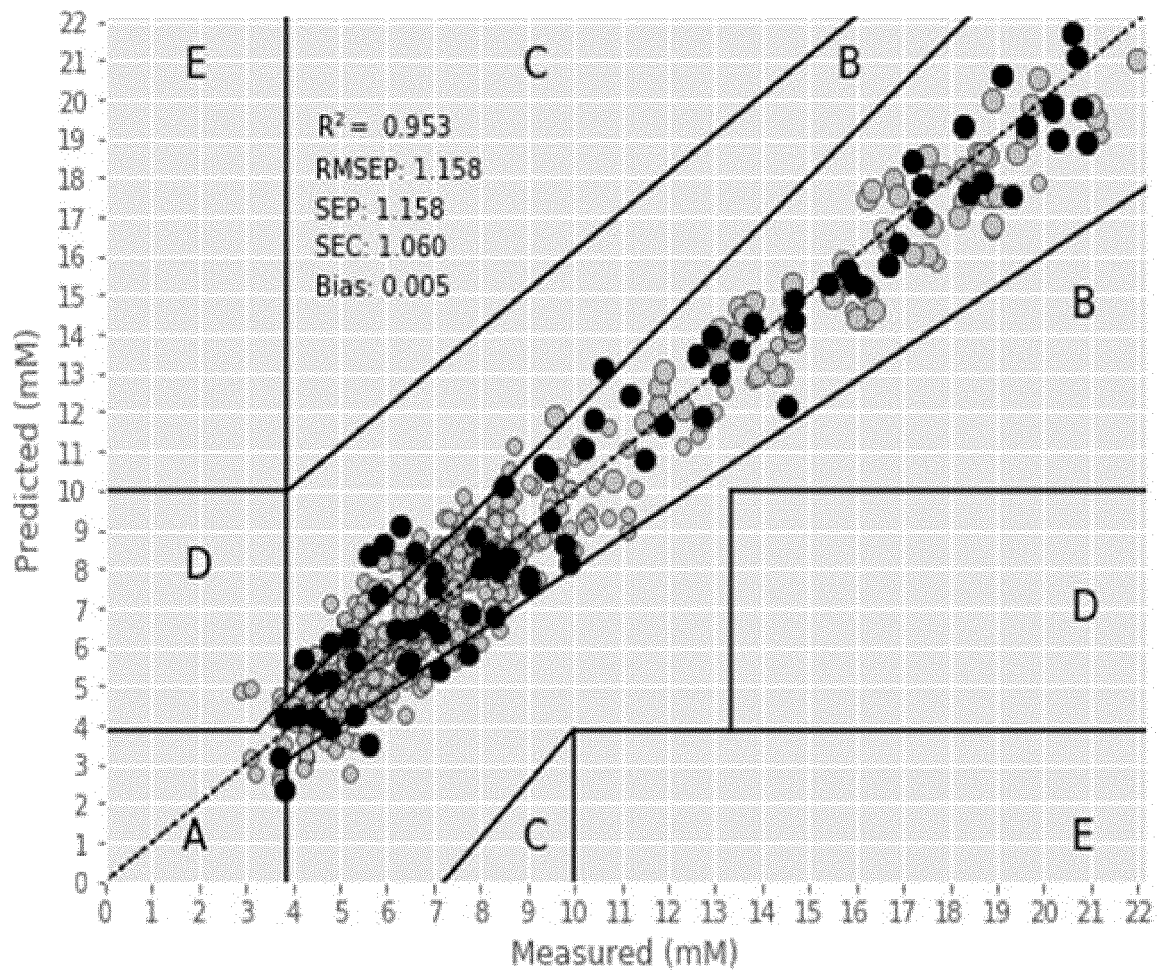
FIG. 13 is an experimental glucose sensor calibration curve obtained from whole blood of 28 different individuals.

An example of an experimental glucose sensor calibration curve from whole blood is shown in FIG. 13. The calibrated value of the concentration can be found for instance by using statistical regression method based on multivariate partial least square algorithm constructed using known target molecule absorbance and corresponding concentration data within the physiological substance. In FIG. 13, the physiological substance is whole blood, but it can also be, e.g., tissue, interstitial fluid, blood plasma, blood serum, etc. Here, over 500 datasets from 28 different individuals were used, using a laser device in accordance with embodiments of the invention. An experimental determination coefficient of 95% is achieved with a root-mean square error of 1.15 mmol/l in a 3-20 mmol/l concentration range. 85% of the data points reside in the area of Clarke grid indicating clinically correct decisions. Sensors in accordance with embodiments for the invention may be modified to detect concentrations of multiple molecules such as lactates, urea, serum albumin, creatinine and others. In other practical scenarios, where only the fact of presence or absence of the target molecule species of interest is needed, the calibration procedure using statistical regression may not be required and a threshold condition can be applied. In this case, only as-measured laser intensity signal modification may be sufficient.

In FMCW LIDAR applications, the widely tunable laser source is used to image the environment, and record key indicators of remote objects. Key indicators include distance to at least one point of a remote object, object velocity, object topography, elemental composition of the medium between the laser-based system and the object, elemental composition of the object, and combinations thereof. See, for example, Quack, Niels, et al. "Development of a FMCW LADAR Source Chip Using MEMS-Electronic-Photonic Heterogeneous Integration", *GOMACTech Conference*. 2014. p. 13-4; Amman et al., "Laser ranging: a critical review of usual techniques for distance measurement, *Opt. Eng.* 40 (1) 10-19 (January 2001), and Dilazaro, et al., "Large-volume, low-cost, high-precision FMCW tomography using stitched DFBs," Optics Express, Vol. 26, No. 3 (5 Feb. 2018) 2891-2904, each of which is incorporated herein in its entirety.

FIG. 14a illustrates the working principle of a typical FMCW LIDAR system. The output 800 of a wavelength tunable laser 100 is split by, for example, a beamsplitter 200 into a target arm 810 and a reference arm 820. The distances to a reference object 1200 and a target object 1000 (also referred to herein as a remote object) are different, denoted by R and R+L respectively. The reflected beams 900 and 910 are directed to a photodetector 700, which records the measured power as a function of time, herein referred to as oscillating response signal. Referring to FIG. 14b, the wavelength (or equivalent frequency) of the laser source 100 is continuously tuned. Because of the path length difference, the frequency of the target arm is different from the reference arm. The tuning curve is shifted in time by $$\Delta t = 2L/c$$

with c the speed of light, shown by f (t-Δt). As the frequency is different, a beat node occurs in the oscillating response signal measured at the photodetector, given by the difference in frequency between the reference arm and target arm. Referring to FIG. 14c, for a linearly changing laser frequency, the beat frequency is constant in time, defined by the frequency difference per unit time γ and the time difference of the arms Δt. Because the beat frequency is constant, the oscillating response signals measured at the detector 700 is a simple sine function as depicted in FIG. 14e, the Fourier transform of which is shown in FIG. 14d. Thus, one can measure the beat frequency $f_{Beat}$ and the frequency change γ is known from the laser, meaning that Δt and distance L can readily be extracted.

Figure 15B:
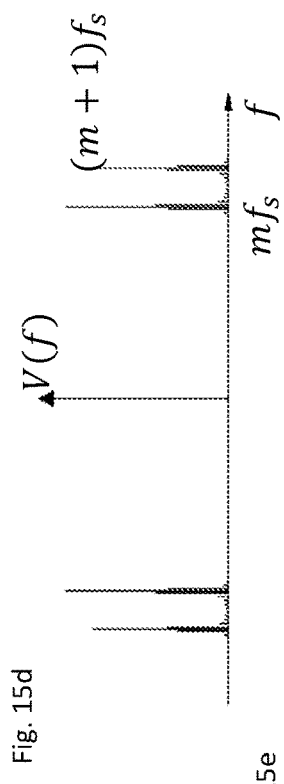
FIG. 15a is a schematic diagram and FIGS. 15b-15e are graphs illustrating a mode-hopping FMCW LIDAR, in accordance with embodiments of the invention.
Figure 15D:
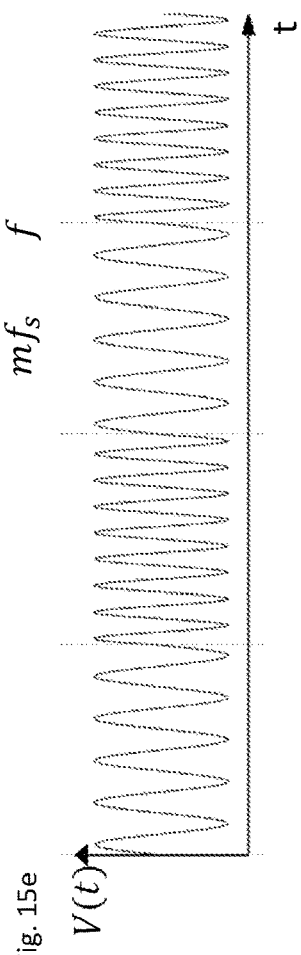

As discussed above, a typical FMCW LIDAR system requires a linear frequency tuning of the laser light source. When the laser exhibits mode hops, this is not possible. For example, referring to FIGS. 15a-15e, a laser device, in accordance with an embodiment of the invention, based on a Vernier-filter configuration of coupled microresonators (for example, microrings, or sampled gratings), hops from one wavelength to another as one of the resonators is tuned by an external control signal (mechanical change, thermal, electrical or other control signals), as illustrated in FIG. 15b. When properly analyzed, the key indicators can still be extracted.

Figure 15A:
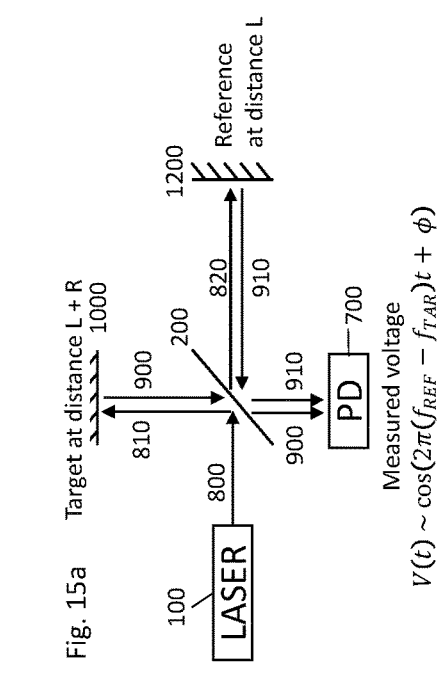
Figure 15C:
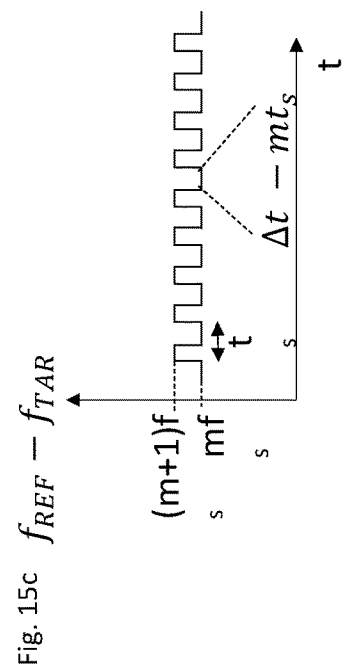
Figure 15E:
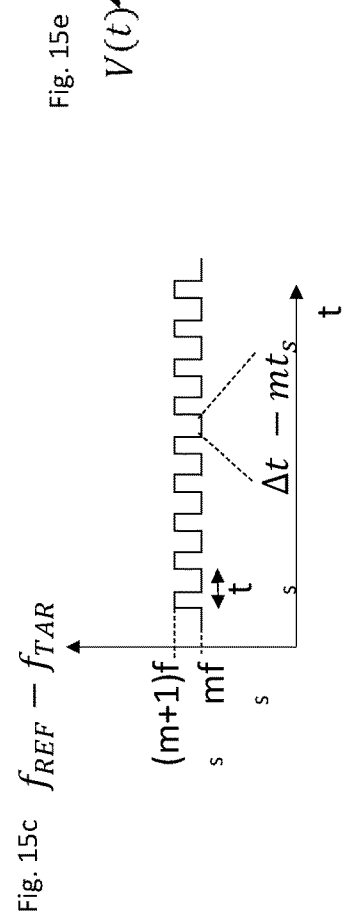

Distance and/or topography can be determined as follows. The basic configuration in FIG. 15a is the same as in FIG. 14a, with the output 800 of laser light source 100 split in two arms 810 and 820 by a beamsplitter 200 and the interference of the reflected signals 900 and 910 being tracked by the detector 700. Now, however, the wavelength (or frequency) hops from one value to another however. This behavior can be represented by a staircase function, as in FIG. 15b. Mathematically this is expressed as $$f(t) = f_s \Sigma_n H(t - nt_s)$$

with $f_s$ being the frequency hops and $t_s$ the time between two hops. H (t) is the Heaviside function. The delayed signal from the target arm is also shown by f (t-Δt). The oscillating response signal measured at the detector 700 fluctuates with the frequency difference between the two arms (FIG. 15e), but contrary to the typical LIDAR, this is no longer constant. FIG. 15c shows the resulting frequency difference. It is a square wave function, where two frequencies are present, being an integer amount of the frequency hops $f_s$. The integer m is unknown at the moment. The Fourier transform of the photovoltage at detector 700, (FIG. 15d), shows these two frequencies. These can be measured and the frequency hops $f_s$ is a function of the system. The integer m can thus be extracted. Note that the spacing between the frequencies is $f_s$ and can be used as a verification. From the relative amplitudes of the spectral lines in the Fourier spectrum, one can deduce the duty cycle of the square wave, and therefore Δt and the distance L can be extracted unambiguously.

In practice, a Vernier-type or other mode-hopping widely tunable laser demonstrates a superposition of an ideal mode-hop-free laser and a stair-case laser, resulting in a sloped staircase laser (FIG. 16a-e). The principle of operation is identical to the staircase laser and the resulting Fourier transform results in frequencies shifted by the beat frequency term γt.

While the above discussion focused on the distance L or topography as the to-be-extracted property, other key indicators can also be measured. For example, the velocity of a remote object may be calculated. If the target 1000 (remote object) is moving at a speed v, shown in FIG. 17, the well-known Doppler effect causes a frequency shift in the target arm. The frequency of reflected signal in the target arm 900, is shifted by the Doppler shift, mathematically expressed as:

$$f_{Dopp} = \frac{2v_T}{c} f$$

where $V_T$ is the velocity of the target object, c the speed of light and f the frequency of the light before the target is reached (810 in FIG. 17a). This Doppler shift is found back in the resulting frequency difference (FIG. 17c) where an extra term is added to the present beat frequencies, as well as in the Fourier transform of the photovoltage of the detector 700 (FIG. 17d). In a simple analysis the extra Doppler term results in an offset of the predicted distance, since an extra distance is also translated to a frequency shift. In other words, a set of solutions for distance—velocity is found. A second measurement makes it possible to distinguish between both, as the new set of solutions overlaps with the previous at only one distance—velocity pair. Note that the relation $$v = \frac{dL}{dt}$$

allows one to further refine this.

Figure 18A:
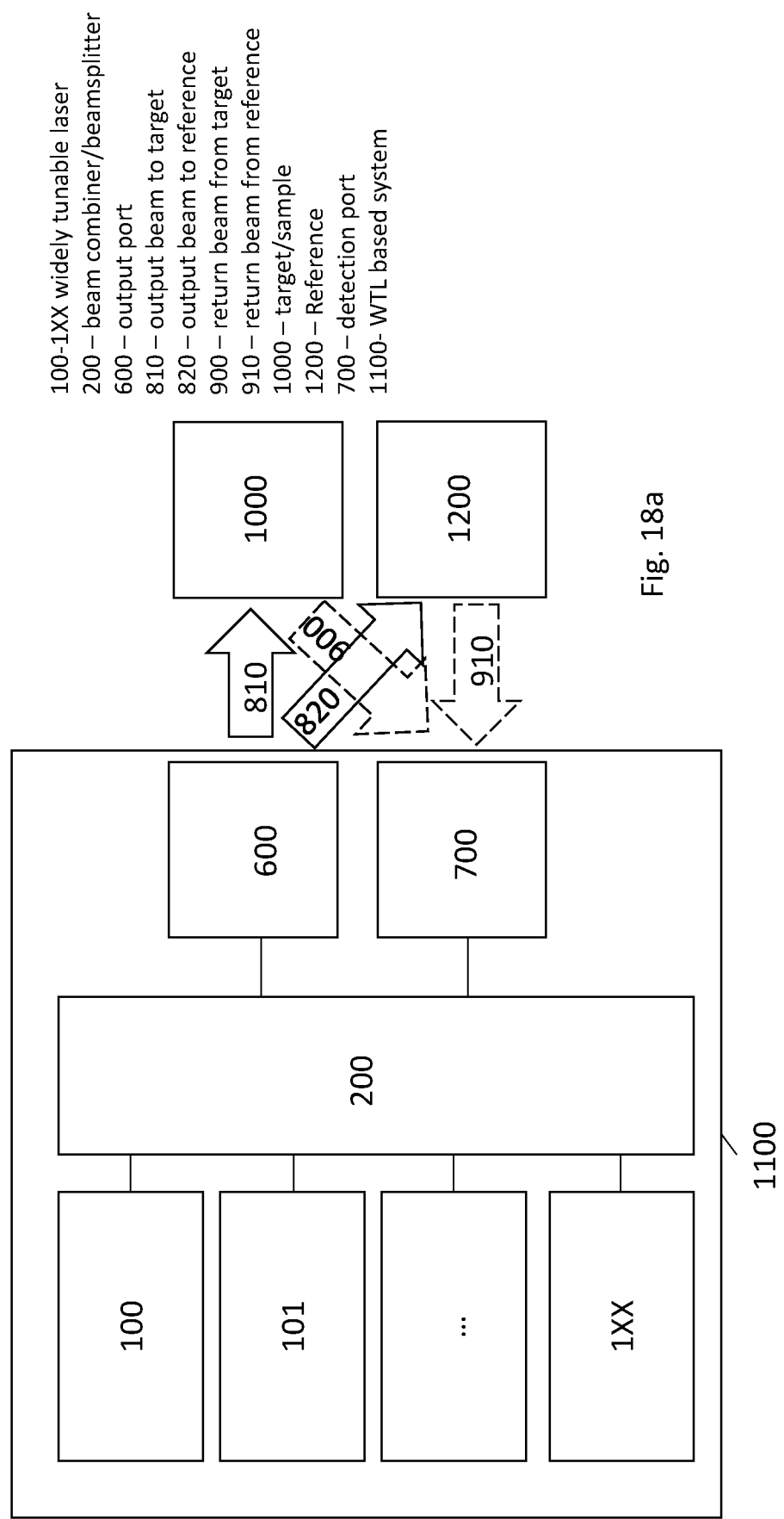
FIGS. 18a and 18b are schematic block diagrams of widely-tunable-laser-based LIDAR, in accordance with embodiments of the invention.
Figure 18B:
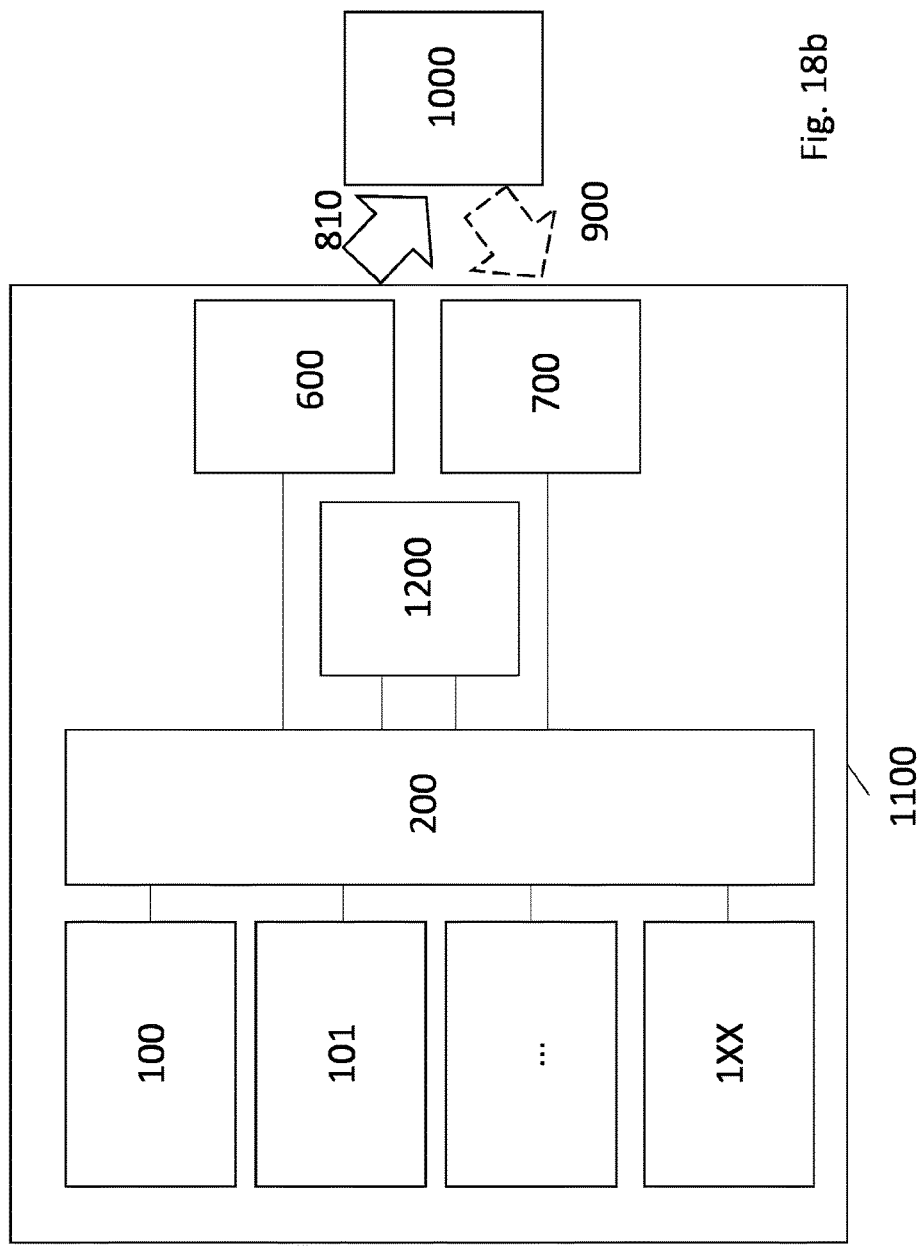

Possible architectures for constructing a mode hopping FMCW LIDAR system are depicted in FIGS. 18a and 18b. A widely tunable laser array 100, 101, . . . 1XX is combined via a beam combiner 200, which can be a single waveguide, multiple waveguide array, or a multimode interference device. The combined beam is directed to an output section 600 which may be formed with free space optics and/or fiber-optic interface which can be a grating coupler, multiple grating couplers, phased array, an output mirror, or an end-fire waveguide. The tunable laser light is then coupled onto a target 1000 via the free-space beam or an optical fiber delivery 800 which can be any object in the to-be-monitored environment, e.g., a remote object. Part of the light is reflected back to the LIDAR system via return beam 900 and collected via signal photodetector 700. A second output beam 810 is delivered to a reference object 1200 which has a known distance from the LIDAR. This can be, e.g., a reference mirror calibrated beforehand. The reflected beam 910 is also collected the signal photodetector 700. The photovoltage or photocurrent of this detector 700 is converted into a distance to the target object. FIG. 16b shows a second possible architecture for constructing this mode hopping FMCW LIDAR system 1100, where the reference arm does not exit the LIDAR system. This reference arm 1200 can be, e.g., a spiraled waveguide or a slow light waveguide, and realized monolithically within, e.g., the photonic integrated circuit.

A practical application of a laser-based system described herein is remote measurement of the elemental composition of a medium between the laser-based system and a remote object by means of spectroscopic sensing. An example of measuring a remote object's elemental composition was already discussed with respect to the biosensor application embodiment. In other practical cases, the elemental composition of the medium between the laser based system and a certain remote object can be of interest. For instance in environmental sensing applications, security applications, industrial applications etc., the medium can be gas-phase, liquid phase or solid-state, and may contain molecules that have molecule specific absorption properties, as in the case of gas sensing or liquid sensing. A simple scenario to determine elemental composition of the medium is to first determine the optical path between the laser-based system and the object and determine the number of times the light travels this distance before being detected. The laser-based system provides a wide wavelength sweep, which may then be calibrated into absolute wavelength domain within the first sweep, allowing one to know the exact spectral properties of the beam that was sent to the object through the medium. The reflected beam from the object may then be compared to the sent beam, revealing modified parts of the spectrum due to light-medium, light-object or a combination of both interactions. This information can then be quantitatively evaluated by using the distance to the object and the number of times the light travels before being detected by the laser-based system using Beer-Lambert law. This capability is very important for remote sensing applications such as searching for gas leaks, contamination, traces of hazardous or process-specific indicators relevant for the field of application (industrial processes, forensics, environmental monitoring, security, etc.).

In another application, laser-based systems in accordance with embodiments of the invention may be used for secure identification, for instance secure face recognition. A laser-based system can be organized to perform a 2D raster scan or can be organized in a 2D array, depending on the system configuration requirement. The measurement of a distance from the laser-based system to the remote object, for instance a face or another body part to be used as a unique identity mark, provides a unique 3-dimensional image of the object with a very high resolution. In addition, the topological information can be combined with object specific elemental composition and the spectroscopic information as a $4^{th}$ dimension, forming a multi-dimensional (topology+elemental composition) object specific security key.

EXAMPLES

Measurement of Composition of and/or Presence of a Molecule in a Physiological Substance In practical applications, embodiments of the invention may be used to obtain calibrated concentration level data for a target metabolite within a physiological substance such as whole blood, blood serum, blood plasma, skin, tissue, etc. by of tunable laser absorption spectroscopy. Most relevant biomolecules—such glucose, urea, lactate, serum albumin, creatinine, etc. contain C—H, O—H, N—H or an arbitrary combination therein. These bonds move—i.e., stretch, rotate and bend in a characteristic manner—which is molecule specific. If a laser photon energy is tuned to match the energy of the molecule-specific vibration, the light is absorbed in the molecule due to photon-phonon interaction, resulting in modification of the properties of light such as intensity and spectrum. The change in intensity is proportional to the concentration of the target molecule within the substance at the specific wavelengths and thus can be converted to the concentration level. A widely tunable laser can be designed to perform a wavelength sweep across a spectral band with specific absorption features of several molecules. Since absorption properties are molecule-specific and unique—individual contributions can be decoupled and thus concentration levels of the different molecules within the physiological substance deducted.

In case of reflection measurement geometry, the light from the laser-based device may be sent to the object (in this case a physiological substance), where it is diffusely scattered and interacts with the molecules within the substance. The diffusely reflected signal is collected by the photodetector and analyzed.

The diffuse reflectance measurement using a laser based device according to embodiments of the invention may be used to collect diffuse reflectance spectra $R(\lambda)$, which in turn can be converted to absorbance $A(\lambda)$ by the relation:

$$A(\lambda) = \log_{10}\left(\frac{1}{R(\lambda)}\right).$$

The collected absorbance spectrum is composed of a sum from individual absorbance spectral components of the contributing molecular species:

$$A(\lambda) = \sum_i A(\lambda)_i = A(\lambda)_{H2O} + A(\lambda)_{lactate} + A(\lambda)_{Glucose} + \cdots$$

Using the proposed widely tunable laser-based device, a sensor may be designed such that it emits tunable radiation which covers the characteristic absorption of the molecules within the ensemble by means of a single widely tunable laser emission or an array in accordance with FIG. 11a.

Accordingly, a very complex absorbance spectrum from a very complex scattering matrix—such as human tissue—can be decomposed into individual molecular absorbance components and this absorbance can in turn be converted to a calibrated concentration level by applying Lambert-Beer law:

$$A(\lambda) = \varepsilon_1(\lambda)c_1 + \varepsilon_2(\lambda)c_2 +$$

where $\varepsilon_i$ is the calibrated molar attenuation coefficient and $c_i$ is the concentration.

Calibrated attenuation coefficients for each individual molecules are predetermined and the values stored in the CPU for calibrated algorithm execution to process the experimentally obtained diffuse reflectance spectrum—i.e., to decompose the spectrum into individual absorbance spectral components and calculate calibrated concentration levels.

In particular, in an embodiment, a sensor may include an array of cells, with at least one array cell targeted at a spectral region corresponding to at least one peak of water absorption, i.e., ~1460 nm, ~1900-2000 nm, or ~3000 nm. Another cell in the array may be targeted at a spectral region corresponding to at least one absorption peak of a blood constituent target molecule. The sensor may include a CPU that is programmed to determine a water concentration level and a water absorption spectrum based on the at least one peak of water absorption measured with the at least one array cell. The CPU may also be programmed to remove a baseline and decompose a complex absorbance spectrum in spectral regions covered by array cells adjacent to the at least one array cell to reveal underlying target molecule absorption features. Further, the CPU may be programmed to convert diffuse reflectance spectra to absorbance. The absorbance may include a collected absorbance spectrum including a plurality of individual absorbance spectral components decoupled by using information from adjacent array cells operating in different spectral regions where no overlap with other molecular absorption exists.

The described algorithm in combination with the sensor architecture described herein allows one to decompose an absorption spectrum of arbitrary complexity into individual components and thus evaluate of the concentration of each individual constituent. This may be facilitated by having prior knowledge of individual attenuation coefficients of each individual interfering species at a given wavelength. In circumstances when the attenuation coefficients for some of the interfering species are not known, the ability to subtract any known or possible spectral contributions greatly improves the accuracy of signal processing algorithms such as multivariate partial least squares or principle component regression method to obtain a calibrated concentration level of a target molecule. An experimental sensor calibration curve in accordance with an embodiment of the invention is presented in FIG. 13, where calibrated levels of glucose concentration within whole blood are measured.

Measurement of a Distance to a Remote Object

A laser-based device in accordance with embodiments of the invention may be used to measure the distance to a remote object, e.g., to a point on a surface of the remote object. The following illustrative example explains how to extract the relevant information.

Given a laser with center wavelength 2100 nm (or equivalent $f_{center}$=142.86 THz), the mode hops of the wavelength tuning function are 0.4 nm, corresponding to a frequency hop of $f_s$=27.212 GHz, over a span of 10 nm. A hop is taken every $t_s$=500 ns. The to-be-calculated distance to the remote object is L+R=100 m, while the reference object is very close at R=0 m.

Due to the difference in path length, the delay time between the reflected beams 900, 910 (FIG. 15) is $$\Delta t = \frac{2L}{c} = 666 \text{ ns}.$$

Note that this time delay covers more than one hop: $\Delta t$=666 ns=(m+DC)$t_s$ where integer m=1 and the duty cycle DC=0.33. The frequency difference $f_{REF}$-$f_{TAR}$ is a square wave function with lower frequency being $mf_s$=27.212 GHz and the upper frequency (m+1)$f_s$=54.424 GHz, the duty cycle is 33% and the period 500 ns.

The measured oscillating response signal of the photodetector 700 is V(t)=cos [2π($f_{REF}$-$f_{TAR}$)t]. After taking the Fourier transform, two peaks can be discerned, the first one at 27.212 GHz and the second at 54.424 GHz, where 33% of the power is located in the latter. From this, the integer m can easily be extracted from the frequency location of the peaks, while the duty cycle of the square wave function must be 33%. The delay time can be computed as $\Delta t$=(m+DC)$t_s$=666 ns, since $t_s$ is known to be 500 ns. From this delay time the sought after distance L is 100 m.

Measurement of a Velocity of a Remote Object

A laser-based device in accordance with embodiments of the inventions may also be used to measure the velocity, as well as the distance, of a remote object.

Given the same laser as above, the remote object may be at a distance L+R=100 m, moving at a velocity v=200 km/h. The reference object is close to the lidar R=0 m and standing still. Due to the path length difference the time delay is $$\Delta t = \frac{2L}{c} = 666 \text{ ns}.$$

Similar to above, the frequency difference is a square wave with period 500 ns and duty cycle 33%. The frequencies are now shifted by the Doppler frequency however $$f_{Dopp} = \frac{2v}{c} f_{center} = 53 \text{ MHz}.$$

The Fourier spectrum of the oscillating response signal, measured at detector 700, exhibits these frequencies at 927.265 GHz and 54.477 GHz, the latter holding 33% of the power. Knowing the location of the frequency to be $mf_s$+$f_{Dopp}$ and (m+1)$f_s$ +$f_{Dopp}$ respectively, combinations of integer m and Doppler shift frequency $f_{Dopp}$ can be made. In this case: if m=0 the Doppler shift must be 27.265 GHz; if m=1 the Doppler shift must be 53 MHz; etc. From the duty cycle of 33% and the integer m, the time delay can be reconstructed $\Delta t$=(m+DC)$t_s$, and thus also the distance $$L = c\frac{\Delta t}{2}.$$

From the Doppler shift, the velocity is extracted $$v = \frac{c}{2} \frac{f_{Dopp}}{f_{center}}.$$

With the numbers used the following solutions may exist: for m=0 the distance is L=25 m and the velocity v=103000 km/h; for m=1 the distance is L=100 m and the velocity v=200 km/h; etc.

To distinguish between these solutions, the velocity in the expected range may simply be chosen, as the solutions differ very much. Alternatively, a second measurement is taken at time t' later yielding solutions L' and v'. Since L'=L+v t', the correct solution can be chosen.

Measurement of the Topography of a Remote Object

A laser-based device in accordance with embodiments of the invention may also be used to measure the topography of a remote object. In such case, a 2D scan is performed, thereby measuring the distance to each point of the remote object.

Each point is defined by the size of the laser spot, limited by the Abbe diffraction limit down to the size of the wavelength, and the resolution of the scanning optics. As an example, one may consider a flat remote object with holes 1 m deep, disposed 100 m away. Given the parameters from above, a distance of 100 m yields a duty cycle of 33.3%. The holes, being 1 m further away, yield a duty cycle of 34.7%. A similar calculation as above is done for all points in the 2D scan. The scan dimensions may cover the entire angle space—up to 360 degrees depending on the object size and system configuration.

Remote Measurement of the Elemental Composition of a Medium Between the Laser-Based System and a Remote Object In a practical scenario, when the distance from the laser-based system to the object is known or measured as per previous example, the elemental composition of the medium can be measured using the spectroscopic measurement of the absorbance of the medium. As in the case of the spectroscopic biosensor for measuring the elemental composition of the physiological substance, the medium between the laser-based device and the object can be seen as an ensemble of constituents—for example molecules—each of them providing a specific contribution to the absorbance spectrum of the medium. $A(\lambda) = \Sigma_i A(\lambda)_i = A(\lambda)_2 + A(\lambda)_3 + A(\lambda)_4 +$ Here, $A(\lambda)_{1,2,3}, \ldots$ is the individual absorbance contribution from the different elemental constituents of the medium.

The individual absorbance can be further expressed as:

$$A(\lambda) = \varepsilon_1(\lambda) c_1 + \varepsilon_2(\lambda) c_2 +$$

where $\varepsilon_i$ is the calibrated molar attenuation coefficient and $c_i$ is the concentration.

In case of a medium, with a thickness of l, the absorbance for each elemental constituent is:

$$A(\lambda)_1 = \int_0^l \varepsilon(\lambda) c(z) dz$$

The laser-based device provides a sweep across a bandwidth where overtone (first, second-) or fundamental absorption due to C—H stretch or a combination of C—H, O—H, N—H stretch is present. The light travels through the medium to the object, where the distance to the object is known or measured, the light is reflected and travels back to the laser-based system through the medium, thus passing the medium twice. The laser-based system then detects the reflected signal and performs absorbance measurements of each individual contribution at the element-specific wavelengths, in such way decomposing the ensemble into individual contributions. In the case when the optical path is known, molar attenuation coefficients of the individual elements is known from databases or reference measurements, the measured absorbance change can be used to calculate the individual elemental concentrations and thus the composition of the medium.

Face Recognition for Security Purposes

A laser-based device in accordance with embodiments of the invention may be used to provide a security key based on facial recognition. An object specific (e.g., face specific) multi-dimensional image of a remote object (e.g., a user's face) may be formed by placing the user at a certain distance, which can be from several centimeters to several or tens or 100 s of meters from the laser-based system and emitting a light from the laser-based device towards the user's face. A 2D scan preferably has sufficient points to reconstruct the topography of the entire face or part of the face, suitable for acting as a unique and person-specific image; for example the 3D scan may range from several square centimeters to several tens of square centimeters. The face image may be recorded as topographic image (see the example above) and the information may be stored as a person-specific security key. In addition to topography, spectroscopic features unique to the person's face, such as a tattoo or physiological data, may be used in combination with topography.

The described embodiments of the invention are intended to be merely exemplary and numerous variations and modifications will be apparent to those skilled in the art. All such variations and modifications are intended to be within the scope of the present invention as defined in the appended claims.

The invention claimed is:

1. A method for performing spectroscopic sensing of a substance, the method comprising:
    providing a solid state laser-based device comprising:
        a solid-state gain medium based widely tunable laser for emitting light;
        a wavelength shift tracking device for tracking a wavelength shift of the emitted light; and
        a solid-state based etalon comprising an optical element having at least one of an unambiguous transmission spectrum or an unambiguous reflection spectrum,
        wherein, during a wavelength sweep of the widely tunable laser, the solid-state based etalon and wavelength shift tracking device are configured to cooperate to provide absolute wavelength determination and control of the widely tunable laser;
    disposing the solid state laser-based device in optical communication with a target object comprising the substance;
    transmitting light emitted from the widely tunable laser to the target object, wherein the transmitted light interacts with molecules within the substance, and light-molecule interactions modify spectral properties of the transmitted light;
    performing a wavelength sweep with light emitted by the widely tunable laser, wherein the emitted light is swept across a spectral bandwidth coinciding with at least one of (i) a fundamental or first overtone of C—H molecular bond stretching vibrations or (ii) a combination of stretching and bending vibrations of C—H, N—H and O—H molecular bonds, absorption spectra of the molecular bond stretching and bending vibrations being molecule-specific and unique;
    in parallel, (i) tracking and recording wavelength shift of the emitted light with the wavelength shift tracking device and (ii) recording absolute wavelength values of the emitted light with the solid-state etalon;
    calibrating a laser tuning curve using a value of the recorded wavelength shift in combination with an absolute wavelength value recorded with the solid-state etalon;
    collecting a light signal from the target object by at least one of transmission or diffuse reflection; and
    processing the collected light signal to characterize the substance.

2. The method of claim 1, wherein characterizing the substance comprises calculating a concentration level of a molecule in the substance.

3. The method of claim 1, wherein characterizing the substance comprises determining a species of at least one molecule disposed in the substance.

4. The method of claim 1, wherein characterizing the substance comprises determining a presence or absence of a molecular species in the substance.

5. The method of claim 1, wherein the target object comprises at least a portion of a human body.

6. The method of claim 1, wherein processing the light signal comprises statistical regression.

7. The method of claim 1, wherein the laser is mode-hopping.

8. The method of claim 1, further comprising:
using the recorded wavelength shift and recorded absolute wavelength values in cooperation to calibrate an entire laser wavelength tuning curve within one wavelength sweep.

9. A method for using a solid state laser-based device to measure a key indicator of a remote object, the method comprising:
providing the solid state laser-based device comprising:
a solid-state gain medium based widely tunable laser for emitting light;
a wavelength shift tracking device for tracking a wavelength shift of the emitted light;
a photodetector; and
a solid-state based etalon comprising an optical element having at least one of an unambiguous transmission spectrum or an unambiguous reflection spectrum,
wherein, during a wavelength sweep of the widely tunable laser, the solid-state based etalon and wavelength shift tracking device are configured to cooperate to provide absolute wavelength determination and control of the widely tunable laser;
performing a wavelength sweep with light emitted by the widely tunable laser;
in parallel, (i) tracking and recording wavelength shift of the emitted light with the wavelength shift tracking device and (ii) recording absolute wavelength values of the emitted light with the solid-state etalon and an etalon photodetector;
calibrating a laser tuning curve using a value of the recorded wavelength shift in combination with an absolute wavelength value recorded with the solid-state etalon;
emitting light with the laser, wherein (i) the laser is mode-hopping and a difference between the mode-hops is known, (ii) a wavelength tuning function of the wavelength sweep is discontinuous, and (iii) light emitted with the laser is divided into two paths, a length of the first path comprising a known distance to a reference object and a length of the second path comprising a distance to the remote object;
after the emitted light impinges upon the remote object and the reference object and is reflected therefrom, collecting reflected beams reflected from the remote object and from the reference object with the photodetector, and mixing the reflected beams at the photodetector, wherein the photodetector provides an oscillating response signal; and
calculating the key indicator of the remote object.

10. The method of claim 9, wherein the key indicator of the remote object is selected from the group consisting of distance, velocity, topography, composition, and combinations thereof.

11. The method of claim 9, wherein the wavelength tuning function is selected from the group consisting of a staircase function, a sloped staircase function, a linear function, and an arbitrary superposition of the staircase function, the sloped staircase function, and the linear function.

12. The method of claim 9, wherein an oscillation frequency of the oscillating response signal is a periodic function in time defined by (i) a period being a time between two mode-hops of the laser; and (ii) a duty cycle defined by a relative amplitude of a Fourier transform of the oscillating response signal and the two beat frequencies present in the Fourier transform of the oscillating response signal.

13. The method of claim 9, further comprising using at least one key indicator to form an object specific security key.

* * * * *